(12) United States Patent
Leng et al.

(10) Patent No.: US 11,715,757 B2
(45) Date of Patent: Aug. 1, 2023

(54) THREE-DIMENSIONAL METAL-INSULATOR-METAL (MIM) CAPACITOR

(71) Applicant: Microchip Technology Incorporated, Chandler, AZ (US)

(72) Inventors: Yaojian Leng, Portland, OR (US); Justin Sato, West Linn, OR (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 18/074,617

(22) Filed: Dec. 5, 2022

(65) Prior Publication Data
US 2023/0096226 A1  Mar. 30, 2023

Related U.S. Application Data

(62) Division of application No. 17/155,431, filed on Jan. 22, 2021, now Pat. No. 11,545,544.

(60) Provisional application No. 63/070,294, filed on Aug. 26, 2020.

(51) Int. Cl.
| | | |
|---|---|---|
| H01L 23/522 | (2006.01) | |
| H01L 23/52 | (2006.01) | |
| H01L 23/528 | (2006.01) | |
| H01L 49/02 | (2006.01) | |

(52) U.S. Cl.
CPC .......... *H01L 28/91* (2013.01); *H01L 23/5223* (2013.01)

(58) Field of Classification Search
CPC ............. H01L 23/5223; H01L 23/5226; H01L 23/528; H01L 23/522; H01L 23/52; H01L 28/90; H01L 28/91; H01L 28/40; H01L 28/60; H01L 28/87; H01L 28/88; H01L 28/75; H01L 24/03; H01L 24/05
See application file for complete search history.

(56) References Cited

U.S. PATENT DOCUMENTS

| | | | |
|---|---|---|---|
| 2005/0024979 A1* | 2/2005 | Kim .................. | H01L 28/40 365/232 |
| 2006/0024899 A1 | 2/2006 | Crenshaw et al. ............ | 438/381 |

(Continued)

OTHER PUBLICATIONS

International Search Report and Written Opinion, Application No. PCT/US2021/019784, 12 pages, dated May 18, 2021.

*Primary Examiner* — Omar F Mojaddedi
(74) *Attorney, Agent, or Firm* — Slayden Grubert Beard PLLC

(57) ABSTRACT

A three-dimensional metal-insulator-metal (MIM) capacitor is formed in an integrated circuit structure. The 3D MIM capacitor may include a bottom conductor including a bottom plate portion (e.g., formed in a metal interconnect layer) and vertically-extending sidewall portions extending from the bottom plate portion. An insulator layer is formed on the bottom plate portion and the vertically extending sidewall portions of the bottom conductor. A top conductor is formed over the insulating layer, such that the top conductor is capacitively coupled to both the bottom plate portion and the vertically extending sidewall portions of the bottom conductor, to thereby define an increased area of capacitive coupling between the top and bottom conductors. The vertically extending sidewall portions of the bottom conductor may be formed in a single metal layer or by components of multiple metal layers.

20 Claims, 19 Drawing Sheets

(56) References Cited

U.S. PATENT DOCUMENTS

| | | | |
|---|---|---|---|
| 2006/0118907 A1* | 6/2006 | Park | H01L 23/5223 |
| | | | 257/532 |
| 2006/0189069 A1* | 8/2006 | Coolbaugh | H01L 23/5223 |
| | | | 257/E21.59 |
| 2008/0203531 A1* | 8/2008 | Imai | H01L 23/5223 |
| | | | 257/E21.011 |
| 2010/0025853 A1* | 2/2010 | Lindgren | H01L 23/5228 |
| | | | 257/763 |
| 2012/0112314 A1 | 5/2012 | Jou et al. | 257/532 |
| 2017/0104056 A1 | 4/2017 | See et al. | 257/532 |
| 2017/0271434 A1 | 9/2017 | Chou et al. | |
| 2017/0309563 A1 | 10/2017 | Zang et al. | |
| 2018/0269276 A1 | 9/2018 | Lin et al. | |
| 2019/0051596 A1 | 2/2019 | Suo et al. | |
| 2021/0249349 A1 | 8/2021 | Liang et al. | |

\* cited by examiner

THREE-DIMENSIONAL METAL-INSULATOR-METAL (MIM) CAPACITOR

RELATED APPLICATIONS

This application is a divisional of U.S. application Ser. No. 17/155,431 filed Jan. 22, 2021, which claims priority to commonly owned U.S. Provisional Patent Application No. 63/070,294 filed Aug. 26, 2020, the entire contents of which applications are hereby incorporated by reference for all purposes.

TECHNICAL FIELD

The present disclosure relates to metal-insulator-metal (MIM) capacitors, and more particularly, to a three-dimensional (3D) MIM capacitor.

BACKGROUND

A metal-insulator-metal (MIM) capacitor is a capacitor constructed with a metal top plate, a metal bottom plate, and an insulator (dielectric) sandwiched between the two metal plates.

MIM capacitors are important components in many electrical circuits, for example many analog, mixed-signal, and radio-frequency complementary metal-oxide semiconductors (RF CMOS) circuits. MIM capacitors typically provide better performance than alternatives, such as POP (Poly-Oxide-Poly) capacitors and MOM (Metal-Oxide-Metal Lateral Flux) capacitors, due to lower resistance, better matching, and/or better signal/noise ratio.

MIM capacitors are typically provided built just below the top metal layer, for example, using the existing Top-1 Metal layer as the bottom plate, constructing a top plate with a different metal (e.g., Titanium or Titanium Nitride (Ti/TiN), Tantalum or Tantalum Nitride (Ta/TaN), or Tungsten (W)), and connecting an overlying Top Metal layer to the top and bottom plates of the capacitor through respective vias. The top plate typically has a higher resistance then the bottom plate, e.g., because the top plate may be limited by thickness constraints and the material of choice for integration, thus limiting the performance of conventional MIM capacitors.

FIGS. 1A and 1B show two examples of conventional MIM capacitor structures. FIG. 1A shows a conventional MIM capacitor 100A built on an aluminum interconnect. MIM capacitor 100A includes an insulator layer 112A formed between an aluminum bottom plate 114A (Top-1 Metal layer) and a metal top plate 116A (e.g., Ti, TiN, or Aluminum (Al)). The Al bottom plate 114A and metal top plate 116A are each connected to a respective contact 120A and 122A (Top Metal layer) by one or more vias 124A and 126A, e.g., each formed by filling a via hole with tungsten (W) or other suitable metal. The insulator layer 112A may be an SiN layer having a thickness of about 500 Å, for example.

FIG. 1B shows another conventional MIM capacitor 100B built on a copper (Cu) interconnect. MIM capacitor 100B includes an insulator layer 112B formed between a Cu bottom plate 114B (Top-1 Metal layer) and a metal top plate 116B (e.g., Ta, TaN, or TiN). The Cu bottom plate 114B and metal top plate 116B are each connected to a respective contact 120B and 122B (Top Metal layer) by one or more vias 124B and 126B, e.g., each formed by filling a via hole with tungsten, copper or other suitable metal. As with capacitor 100A built on an Al interconnect, the insulator layer 112B of capacitor 10B built on a Cu interconnect may be an SiN layer having a thickness of about 500Å, for example. Layer 112B also acts as a dielectric diffusion barrier for the copper of bottom plate 114B.

As used herein, a "via" refers to a conductive via formed by plugging or otherwise depositing a conductive material (e.g., tungsten) in a via hole having a small diameter or width, e.g., a diameter or width below 1 μm, and thus having a relative large resistance, e.g., a resistance of at least 1 ohm per via. For example, conventional vias (e.g., vias 124A, 126A, 124B, and/or 126B shown in FIGS. 1A and 1B) typically have a small diameter in the range of 0.1 μm to 0.5 μm, and may have a resistance of about 10 ohms/via, for example, especially for vias formed from tungsten or other highly resistive material. Thus, conventional MIM capacitors often include multiple vias (e.g., multiple vias between the top plate and top plate contact and/or multiple vias between the bottom plate and bottom plate contact) to reduce the overall resistance to some extent. As used herein, a "via connection" in the context of an MIM capacitor refers to a via extending from a capacitor plate (top plate or bottom plate) to an overlying conductive contact.

In addition, MIM capacitors are typically expensive to build, e.g., as compared with other certain types of capacitors. For example, MIM capacitors typically require additional mask layers and many additional process steps, as compared with POP capacitors and MOM capacitors. MIM capacitors also typically require relatively large areas of silicon, resulting in inefficient area usage, particularly with large MIM capacitors.

In addition, in conventional MIM capacitor 100B, the insulator layer 112B is in direct contact with an upper surface of copper bottom plate 114B, typically resulting in a low breakdown voltage due to Cu hillocks (bumpy surface) at the upper surface of bottom plate 114, e.g., as indicated at "H" in FIG. 1B. Further, in a conventional MIM capacitor, the top plate is thin and thus provides a high series resistance, as the vertical thickness of the top plate is limited by the vertical distance between the adjacent metal layers in which the MIM capacitor is formed, (e.g., top metal layer and top-1 metal layer).

There is a need for MIM capacitors that can be manufactured at lower cost, with improved spatial density, and/or with improved breakdown voltage.

SUMMARY

Embodiments of the present invention provide a three-dimensional (3D) MIM capacitor formed in an integrated circuit structure. The 3D MIM capacitor may include:
(a) a bottom conductor including both (i) a horizontally-extending bottom plate portion and
(ii) at least one vertically extending sidewall portion projecting upwardly from the bottom plate portion,
(b) a top conductor, and
(c) an insulator layer arranged between top conductor and both the horizontally-extending bottom plate portion and the vertically extending sidewall portion(s) of the bottom conductor.

According to this structure, the top conductor is capacitively coupled to both the bottom plate portion and the sidewall portion(s) of the bottom conductor, which defines a substantially larger area of capacitive coupling between the top and bottom conductors, as compared with conventional designs e.g., as shown in FIGS. 1A and 1B.

The 3D MIM capacitors disclosed herein are referred to as "three-dimensional" in contrast with prior art "two-dimensional" (2D) MIM capacitors where the capacitors extend only in the horizontal plane (x,y directions). The 3D MIM capacitors not only have the horizontal portion of the capacitors, but also have "sidewall" portion of the capacitors, where the capacitors extend vertically (z direction). The capacitors disclosed here are thus called 3D MIM because they extend in all 3-dimensions (x, y, and z).

In some embodiments, the 3D MIM capacitors are built within only one layer between the two adjacent metal interconnect layers (including these two adjacent metal interconnect layers), and are labelled as single layer 3D MIM capacitors. In some embodiments, the 3D MIM capacitors are built using multiple interconnect layers (two or more layers between the two adjacent metal layers are involved, and more than two adjacent metal interconnect layers are involved), and are labelled as multi-layer 3D MIM capacitors. Compared to single layer 3D MIM capacitors, multi-layer 3D MIM capacitors extend further in the vertical direction, and achieve better area efficiency, at the expense of process complexity.

Some embodiments provide a single layer 3D MIM capacitor and method of manufacture, while other embodiments provide a multi-layer 3D MIM capacitor and method of manufacture. In some embodiments, the 3D MIM capacitor bottom plate is formed from copper, and lined with W or TiN to improve the break-down voltage (e.g., mitigating negative effects from Cu hillocks), and the top plate is formed from aluminum, which may be manufactured concurrently with bond pad metal, and provides lower series resistance. In some embodiments, the 3D MIM capacitor has significant area efficiency over conventional 2D MIM capacitor due to 3D integration, and thus lower cost.

In one aspect, a 3D MIM capacitor includes (a) a bottom conductor including a bottom plate portion and at least one vertically extending sidewall portion extending upwardly from the bottom plate portion, (b) a top conductor, and (c) an insulator layer arranged between the top conductor and both the bottom plate portion and the at least one vertically extending sidewall portion of the bottom conductor.

In some embodiments, the top conductor is formed in a bond pad layer.

In some embodiments, the bottom conductor includes a cup-shaped portion formed on the bottom plate portion and including the at least one vertically extending sidewall portion.

In some embodiments, the bottom plate portion of the bottom conductor comprises copper, the cup-shaped portion of the bottom conductor comprises tungsten or TiN, and the top conductor comprises aluminum.

In some embodiments, the bottom plate portion of the bottom conductor is defined by a portion of a copper interconnect layer.

In some embodiments, at least one vertically extending sidewall portion of the bottom conductor comprises elements of multiple metal layers of an integrated circuit device.

In some embodiments, the at least one sidewall portion of the bottom conductor is formed in a wide tub opening having a height-to-width aspect ratio in the range of 0.5-2.0, for example in the range of 0.8-1.2.

In some embodiments, the 3D MIM capacitor also includes a bond pad laterally offset from the top conductor and conductively connected to the bottom conductor by at least a first vertically-extending conductive via.

In some embodiments, the bond pad is formed from the same material as the top conductor, and the conductive via is formed from the same material as the at least one vertically extending sidewall portion of the bottom conductor.

In some embodiments, the vertically extending sidewall portion(s) of the bottom conductor is/are formed in a bottom conductor opening, and the conductive via is formed in a via opening, wherein a lateral width of the bottom conductor opening is at least twice as large as a lateral width of the conductive via. In some embodiments, the lateral width of the bottom conductor opening is at least five times as large as the lateral width of the conductive via.

In some embodiments, the bottom conductor opening and the conductive via are formed in a common passivation layer.

In some embodiments, the at least one vertically extending sidewall portion of the bottom conductor is formed in a bottom conductor opening, at least a portion of the insulator layer is located in the bottom conductor opening, and at least a portion of the top conductor is located in the bottom conductor opening and covering at least a portion of the insulator layer. In some embodiments, the top conductor includes a first portion located above a top portion of the insulator layer and a second portion extending downwardly into the bottom conductor opening.

In some embodiments, the insulator layer is cup-shaped and defines an opening, and at least a portion of the top conductor is located in the opening of the cup-shaped insulator layer.

In another aspect, an integrated circuit device includes a plurality of electronic devices, and a 3D MIM capacitor as disclosed herein.

In another aspect, a method of forming a 3D MIM capacitor is provided. The method may include forming a bottom plate of a bottom conductor; forming at least one vertically-extending sidewall portion of the bottom conductor extending upwardly from the bottom plate; forming an insulator layer having a first insulator portion on the bottom plate and at least one vertically-extending second insulator portion on the at least one vertically extending sidewall portion of the bottom conductor; and forming a top conductor on the insulator layer, such that the insulator layer is arranged between the top conductor and both the bottom plate and the at least one vertically-extending sidewall portion of the bottom conductor.

In some embodiments, forming a top conductor includes depositing a bond pad layer, and removing portions of the bond pad layer to define the top conductor and a plurality of bond pads conductively connected to a plurality of integrated circuit elements, wherein the top conductor extends down into an opening defined by the insulator layer.

In some embodiments, forming a bottom conductor plate includes forming a top metal layer of a multi-layer interconnect structure, and removing portions of the top metal layer of a multi-layer interconnect structure to define the bottom conductor plate.

In some embodiments, the method further includes forming a bottom conductor opening and a via opening laterally offset from the bottom conductor opening; forming the vertically-extending sidewall portion of the bottom conductor in the bottom conductor opening; forming a conductive via in the via opening laterally offset from the bottom conductor opening; depositing a bond pad layer; and removing portions of the bond pad layer to define (a) the top conductor and (b) an MIM bond pad laterally offset from the top conductor and in contact with the conductive via, wherein the MIM bond pad is conductively connected to the bottom plate of the bottom conductor through the conductive via.

In some embodiments, the method includes forming the bottom conductor opening and the via opening concurrently, and forming the vertically extending bottom conductor sidewall and the conductive via concurrently.

BRIEF DESCRIPTION OF THE FIGURES

A more complete understanding of the present disclosure may be acquired by referring to the following description taken in conjunction with the accompanying drawings wherein.

It should be understood that the reference number for any illustrated element that appears in multiple different figures has the same meaning across the multiple figures, and the mention or discussion herein of any illustrated element in the context of any particular figure also applies to each other figure, if any, in which that same illustrated element is shown.

DETAILED DESCRIPTION

Figure 1A:
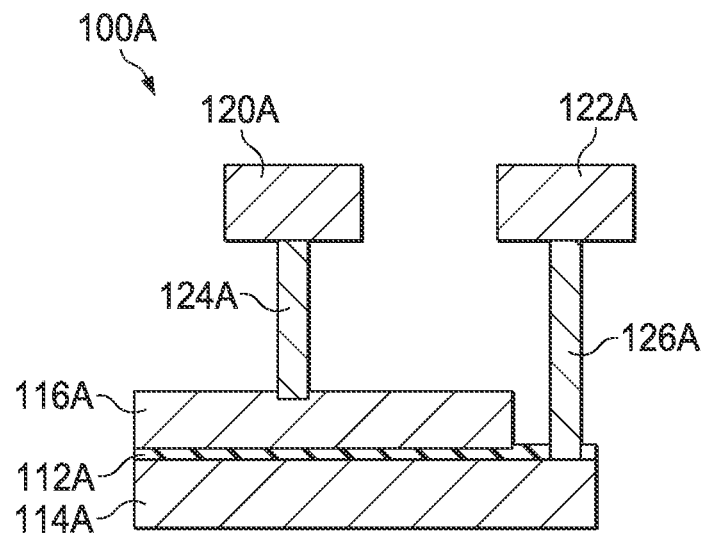
FIGS. 1A and 1B show cross-sectional views of two conventional MIM capacitor structures.
Figure 1B:
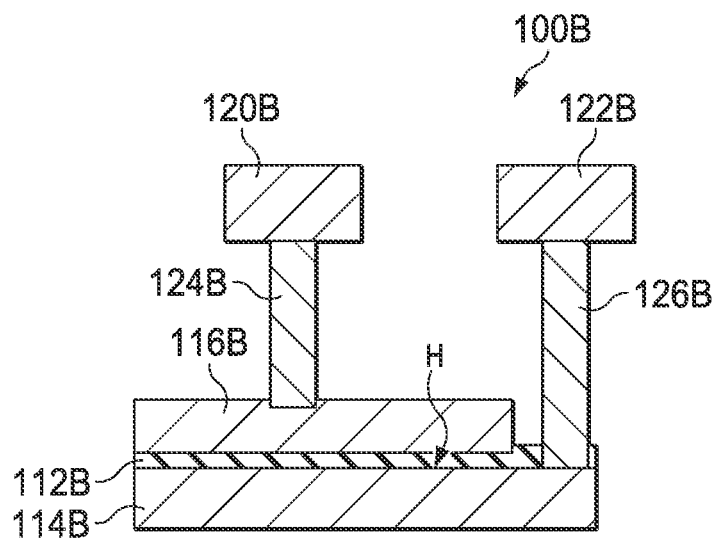
Figure 2:
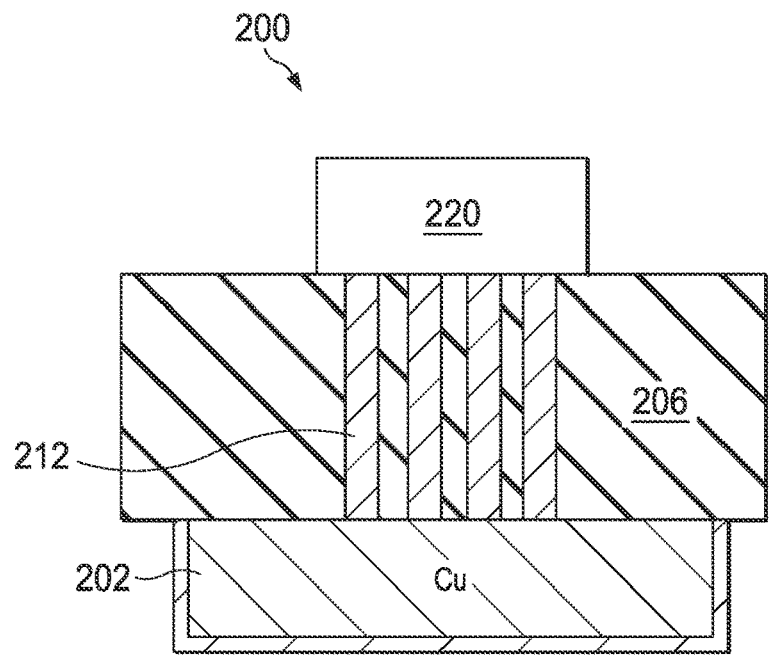
FIG. 2 shows a cross-sectional view of a conventional structure of an aluminum bond pad connected to a copper interconnect structure by tungsten vias.

In the industry, a copper (Cu) interconnect typically ends with an aluminum (Al) bond pad to be fully compatible with legacy packaging process. A group of tungsten (W) vias are typically used to connect the Al bond pad to the top metal layer (MTOP) of the Cu interconnect. FIG. 2 shows a cross-sectional view of an conventional structure 2000 of an Al bond pad 220 connected to a Cu interconnect MTOP structure 202 by W vias 212 formed in a passivation layer 206.

Figure 3A:
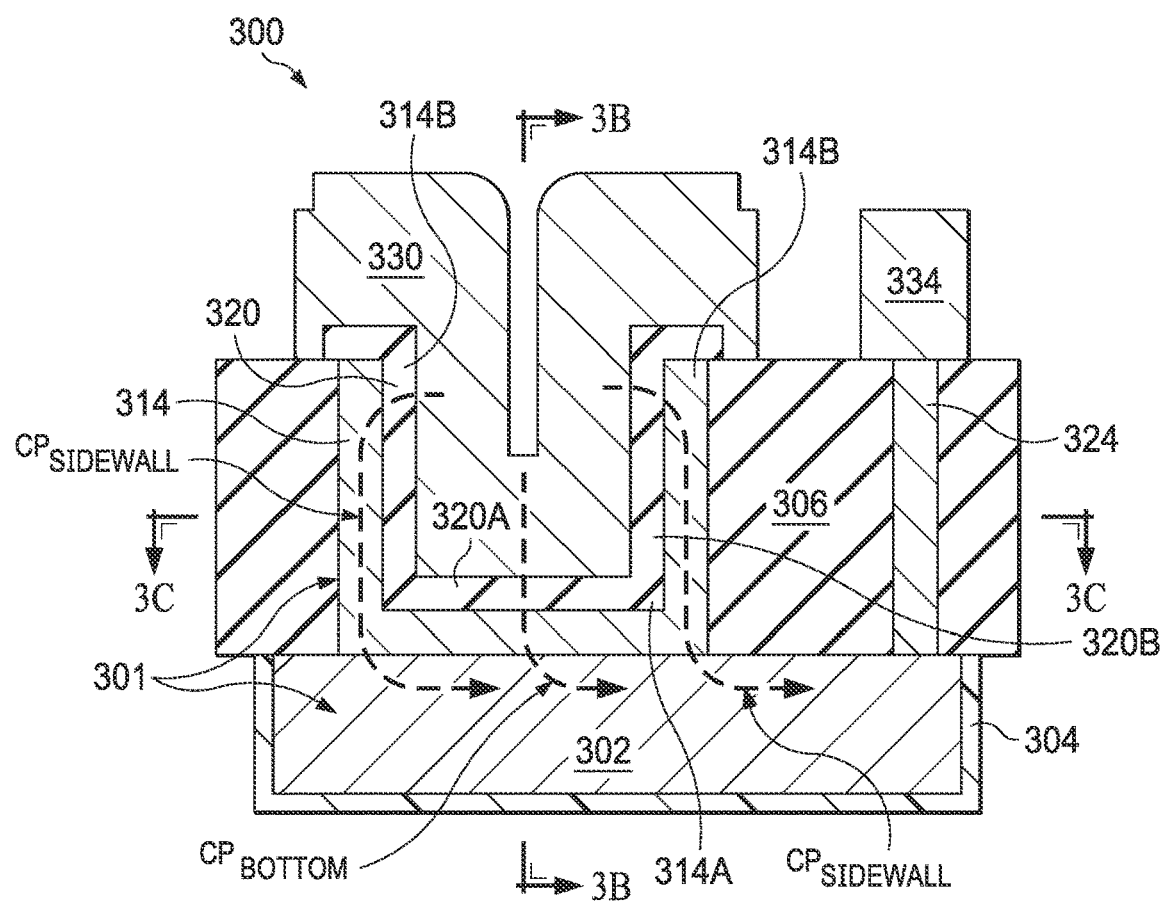
FIGS. 3A-3C show cross-sectional view of an example single-layer 3D MIM capacitor according to one embodiment of the present invention.
Figure 3B:
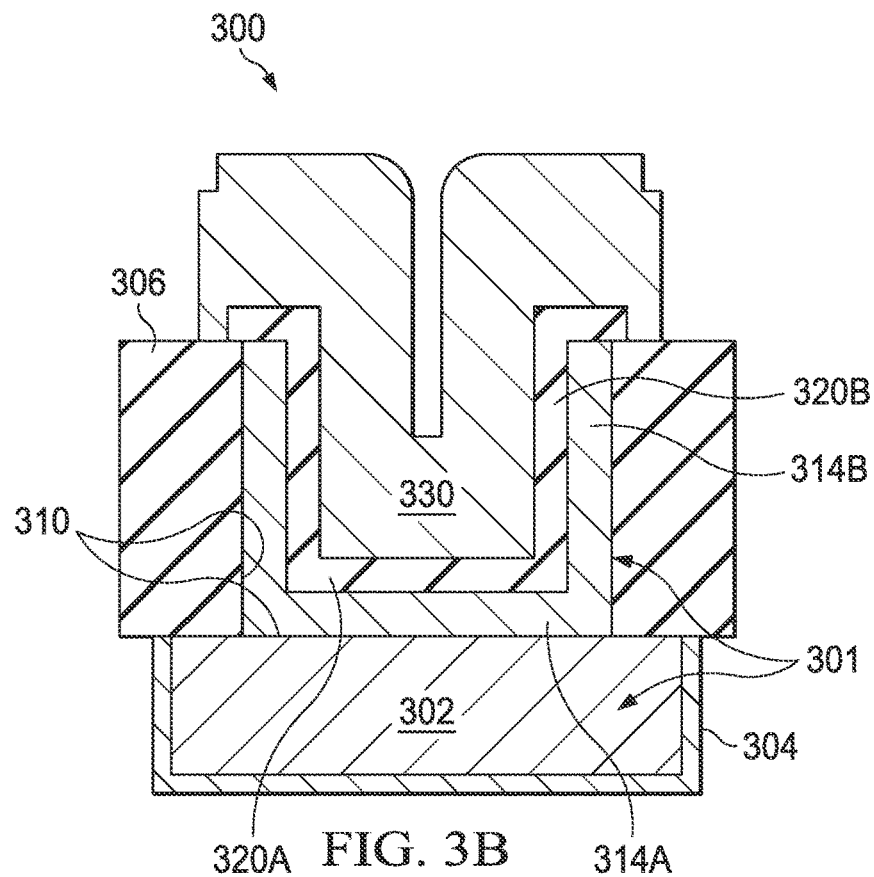
Figure 3C:
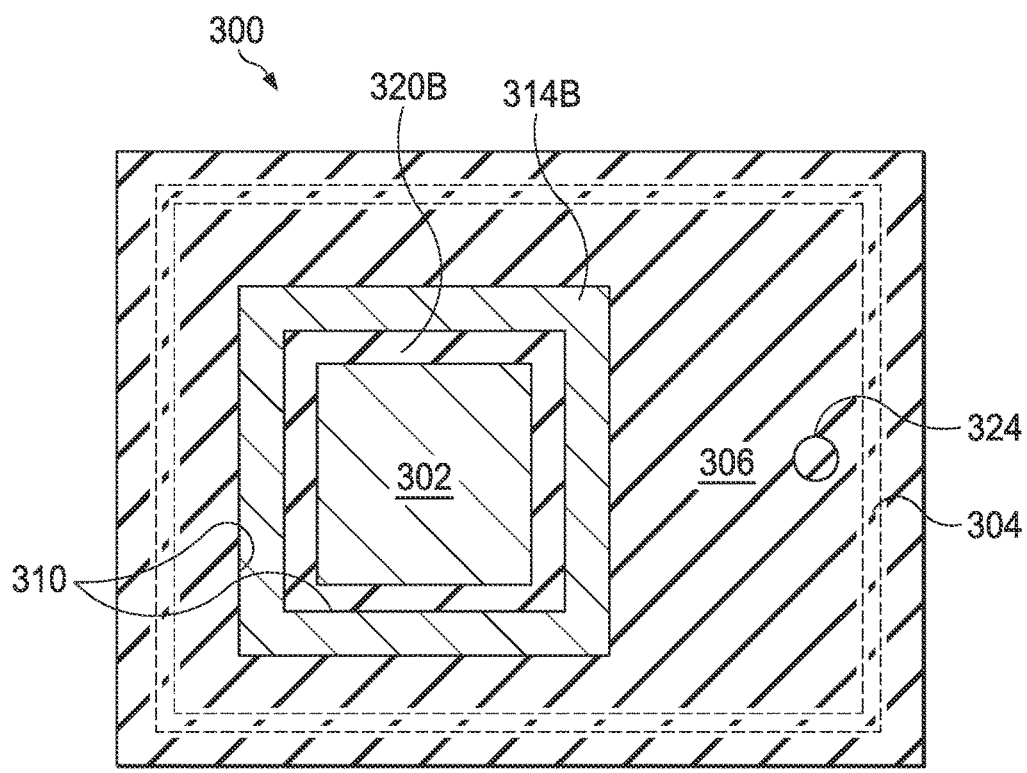

FIGS. 3A-3C collectively show an example single-layer 3D MIM capacitor 300 according to one embodiment of the present invention. In particular, FIG. 3A shows a first cross-sectional side view, FIG. 3B shows a second cross-sectional side view taken through cut line 3B-3B shown in FIG. 3A, and FIG. 3C shows a top-down cross-sectional view taken through cut line 3C-3C shown in FIG. 3A. As shown in FIGS. 3A-3C collectively, a bottom conductor 301 of the MIM capacitor includes (a) a horizontally-extending bottom plate 302 and (b) a cup-shaped conductor 314 formed on the bottom plate 302 and having (i) a bottom portion 314A formed on the bottom plate 302 and (ii) vertically-extending sidewall portions 314B extending upwardly from the bottom plate 302. In some embodiments, the bottom plate 302 may be formed in a copper interconnect layer, e.g., a top copper interconnect layer, referred to herein as the "Cu MTOP layer." Bottom plate 302 may be formed over a barrier layer 304, e.g., a Ta/TaN barrier layer. The cup-shaped conductor 314 may be formed in a bottom conductor opening 310 formed in a passivation layer 306. The bottom conductor opening 310 may be a wide "tub" opening, as discussed herein. The cup-shaped conductor 314 may be formed from tungsten (W) or other suitable material, e.g., formed from the same material and concurrently with conductive via(s) 324, as discussed below. Cup-shaped conductor 314 is in electrical contact with bottom plate 302.

3D MIM capacitor 300 is referred to as a "single-layer" MIM capacitor because it uses only a single metal interconnect layer to form the capacitor 300.

An insulator layer 320 is formed in the cup-shaped conductor 314 and includes (i) a bottom portion 320A formed on the bottom portion 314A of the cup-shaped conductor 314 and (ii) sidewall portions 320B covering the vertically-extending sidewall portions 314B of the cup-shaped conductor 314. The insulator layer 320 may be a conformal layer, formed from SiN or other suitable dielectric material.

A top conductor 330 is formed over the insulator layer 320 and extending down into a cup-shaped opening formed by insulator layer 320, particularly defined by a top surface of bottom portion 320A and surfaces of sidewall portions 320B. As shown, the cup-shaped conductor 314 of bottom conductor 301 substantially increases the area of capacitance between the top conductor 330 and the bottom conductor 301, through both the horizontally-extending bottom portion 320A and the vertically-extending sidewall portions 320B of the insulator layer 320. Top conductor 330 may be formed from aluminum or other suitable material.

The bottom conductor 301 may also be conductively connected to a top-side bond pad 334, e.g., by at least one conductive via 324 connecting the bond pad 334 to the bottom plate 302. In some embodiments, the bottom conductor opening 310 in which the cup-shaped conductor 314 is formed may be formed concurrently with at least one narrow via opening in which the at least one conductive via 324 is/are formed. The bottom conductor opening 310 and via opening(s) may be filled concurrently, e.g., by tungsten deposition, to form the cup-shaped conductor 314 and conductive via(s) 324.

As shown in FIG. 3C, the bottom conductor opening 310 in which the cup-shaped conductor 314 is formed (followed by the insulator layer 320 and top conductor 330) may have a square shape from a top-down view. In other embodiments, the tub opening may have a square shape with rounded corners, rectangular shape, rectangular shape with rounded corners, circular shape, oval shape, cross shape, or any other suitable shape.

As shown in FIG. 3A, the three-dimensional structure of MIM capacitor 300 defines not only a displacement current path through the bottom portion 320A of the insulator layer 320, indicated generally by dashed arrow $CP_{bottom}$, but also displacement current paths through the vertically-extending sidewall portions 320B of the insulator layer 320, indicated generally by dashed arrows $CP_{sidewall}$. Each insulator layer sidewall 320B provides an additional area of capacitive coupling between the top conductor 330 and bottom conductor 301. The bottom portion 320A of the insulator layer 320 effectively defines a plate capacitor, with the top and bottom plates extending horizontally, and each insulator layer sidewall 320B effectively defines an additional plate capacitor, with the top and bottom plates extending vertically. Thus, the three-dimensional structure of MIM capacitor 300 to thereby define a substantially increased area of capacitive coupling between the top conductor 330 and bottom conductor 301, e.g., as compared with a conventional MIM capacitor.

The example 3D MIM capacitor 300 shown in FIG. 3 may be constructed with minimum additional process steps as compared with the existing IC manufacturing process, e.g., using only four additional process steps, including only one added mask layer.

FIGS. 4A-4I show cross-sectional views illustrating an example process for forming an integrated circuit (IC) device including a single-layer 3D MIM capacitor 450, e.g., similar to the example 3D MIM capacitor 300 shown in FIG. 3, according to one embodiment of the invention. Each FIG. 4A-4I shows cross-sectional views at two locations of an integrated circuit structure 400 under construction, namely a first location (labelled "Bond Pad") at which a first bond pad (e.g., aluminum) is connected to top interconnect layer (e.g., Cu MTOP layer) by conductive vias, which is a typical process in the construction of integrated circuits; and a second location (labelled "3D MIM Capacitor") at which the single-layer 3D MIM capacitor 450 is formed, according to one embodiment of the present invention.

Figure 4A:
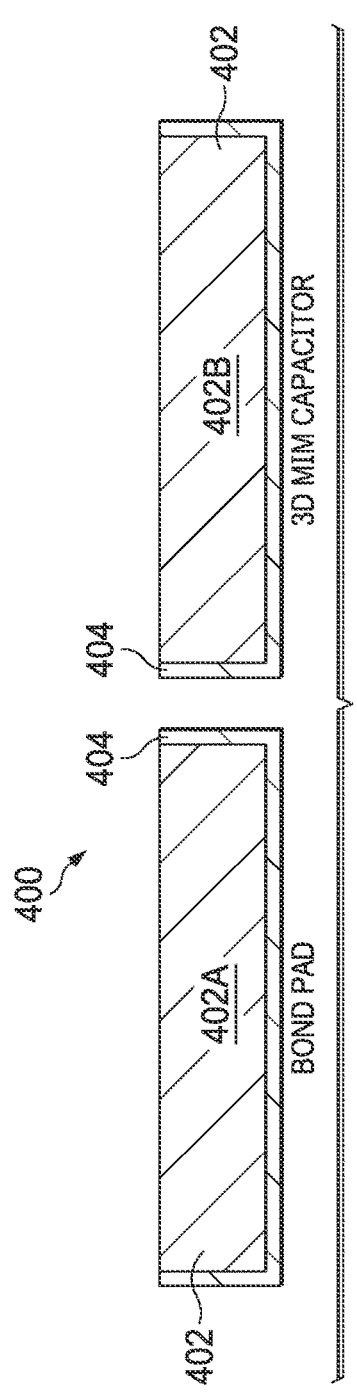
FIGS. 4A-4I show an example process of forming the example single-layer 3D MIM capacitor shown in FIGS. 3A-3C, according to one embodiment of the present invention.

FIG. 4A shows selected portions of a top interconnect layer 402 (e.g., Cu MTOP layer) in the IC structure 400 under construction. A first interconnect structure 402A of the top interconnect layer 402 is designated for a typical bond pad, while a second interconnect structure 402B of the top interconnect layer 402 forms a bottom plate of a bottom conductor of the MIM capacitor 450 under construction. Interconnect structures 402A and 402B may be formed over a respective barrier layer 404, e.g., a Ta/TaN barrier layer, e.g., by a process including Cu deposition over the barrier layer 404, followed by a copper CMP (chemical mechanical planarization) process.

Figure 4B:
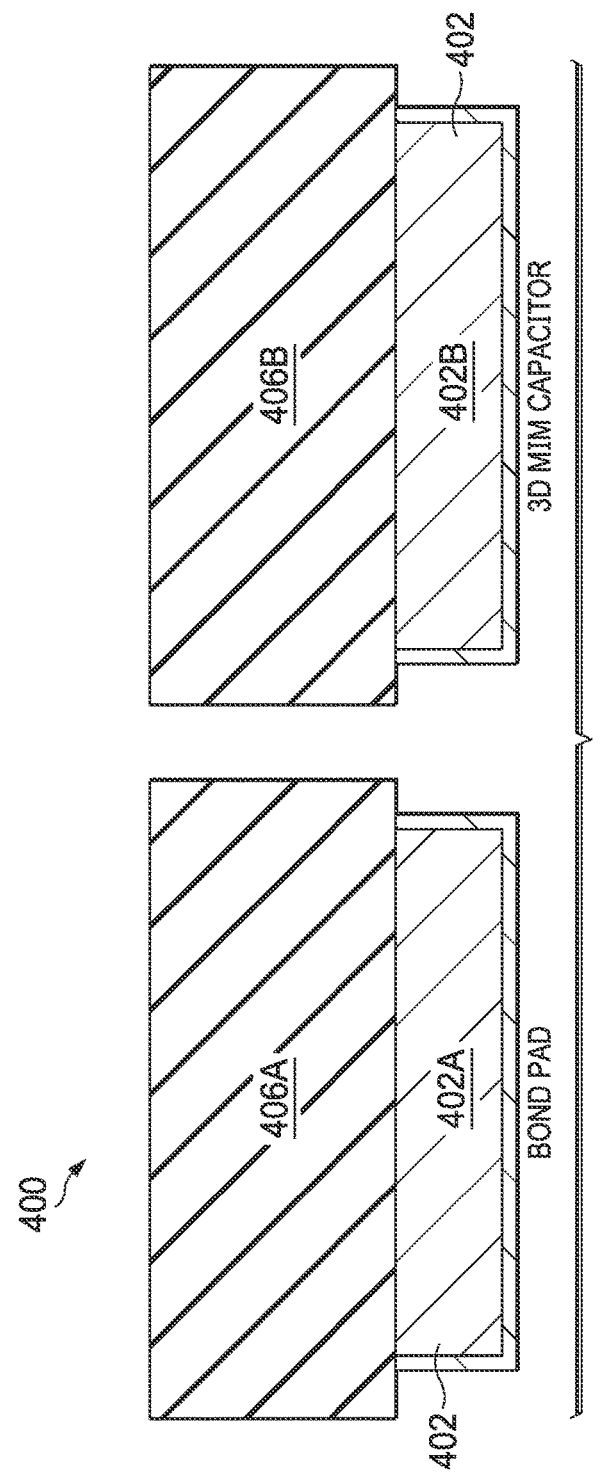

As shown in FIG. 4B, after the top interconnect layer 402 is formed, a passivation region 406 may be deposited over the top interconnect layer 402. The passivation region 406 may include a first passivation region portion 406A over the first interconnect structure 402A, and a second passivation region portion 406B over the second interconnect structure 402B. The passivation region 406 is typically a combination of multiple layers of dielectric films configured to protect underlying active integrated circuits. For example, the passivation region 406 may include the following four layers, deposited in the following order: (1) 0.1 μm Silicon Nitride, (2) 0.1 μm Silicon Rich Oxide (SRO), (3) 0.68 μm Phosphorus Silicate Glass (PSG), and (4) 0.59 μm Silicon oxynitride (SiON).

Figure 4C:
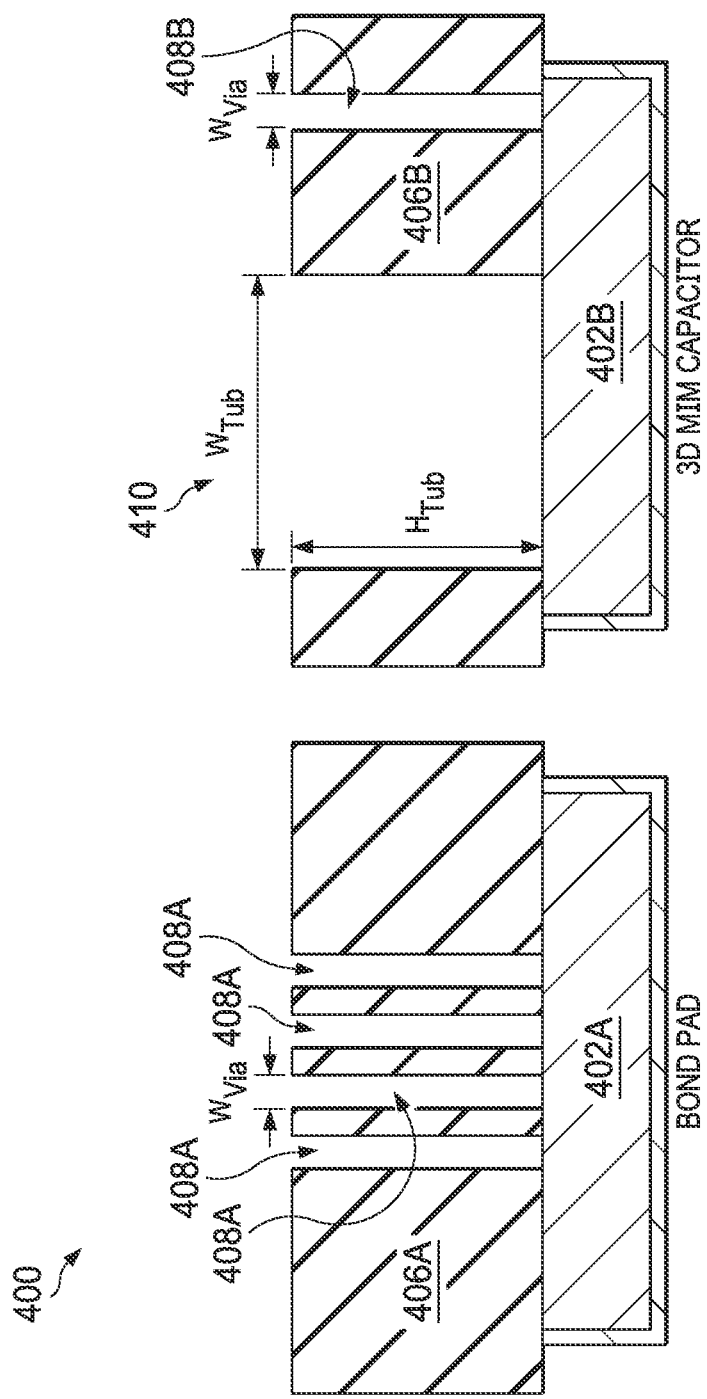

Next, as shown in FIG. 4C, a photoresist layer may be deposited and patterned, followed by at least one etch to define a number of via openings 408A, 408B and a wide tub opening 410 for the 3D MIM capacitor 450 under construction. The via openings 408A, 408B and tub opening 410 may be etched concurrently. The shape and dimensions of the wide tub opening 410 may be selected based on various parameters, e.g., for effective manufacturing of the MIM capacitor 450 (e.g., effective deposition of the top plate material (e.g., aluminum) into the wide tub opening 410) and/or for desired performance characteristics of the resulting MIM capacitor 450. In some embodiments, the wide tub opening 410 may be formed with a width $W_{Tub}$ in the range of 1-10 μm, and a vertical height $H_{Tub}$ in the range of 1-10 μm. In some embodiments, the wide tub opening 410 has a width in a direction into the page in the range of 1-10 μm, which width may be the same as the illustrated width $W_{Tub}$, e.g., in the case of a square or circular opening 410.

In some embodiments, the wide tub opening 410 may be formed with a height-to-width aspect ratio ($H_{Tub}/W_{Tub}$) of less than or equal to 2.0, e.g., to allow effective filling of the wide tub opening 210 by conformal materials. For example, the wide tub opening 410 may be formed with an aspect ratio $H_{Tub}/W_{Tub}$ in the range of 0.1-2.0, for example in the range of 0.5-2.0. In some embodiments, the wide tub opening 410 may be formed with an aspect ratio $H_{Tub}/W_{Tub}$ of less than or equal to 1.5, e.g., for effective filling of the tub opening 210 by conformal materials. For example, the wide tub opening 410 may be formed with an aspect ratio $H_{Tub}/W_{Tub}$ in the range of 0.5-1.5, or more particularly in the range of 0.8-1.2.

In some embodiment, via openings 408A, 408B may be formed with a width $W_{Via}$ in the range of 0.1-0.8 μm. The width $W_{Tub}$ of wide tub opening 410 is larger than the with $W_{Via}$ of via openings 408A and 408B. For example, in some embodiments, the width $W_{Tub}$ of wide tub opening 410 is at least twice as large as the with $W_{Via}$ of via openings 408A and 408B. In particular embodiments, the width $W_{Tub}$ of tub opening 410 is at least five time as large as the width $W_{Via}$ of via openings 408A and 408B.

Figure 4D:
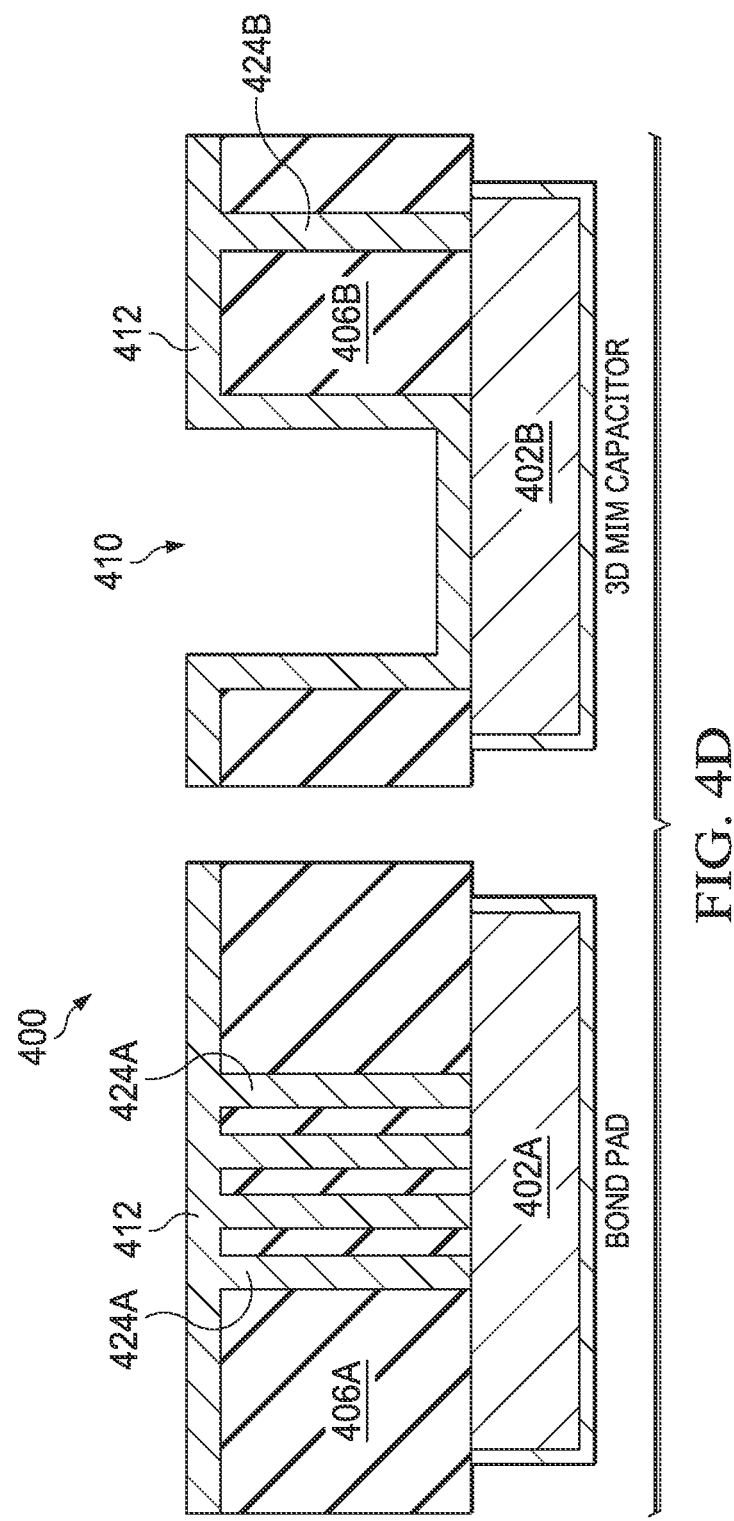

Next, as shown in FIG. 4D, a conductive, conformal material 412, e.g., TiN, W, or other suitable metal, is deposited over the structure 400 such that the material 412 fills the via openings 408A, 408B, to form one or more vias 424A, 424B, and forms a conformal layer over the bottom and sidewall surfaces of the wide tub opening 410. Conductive, conformal material 412 is thus in electrical contact with the second interconnect structure 402B.

Figure 4E:
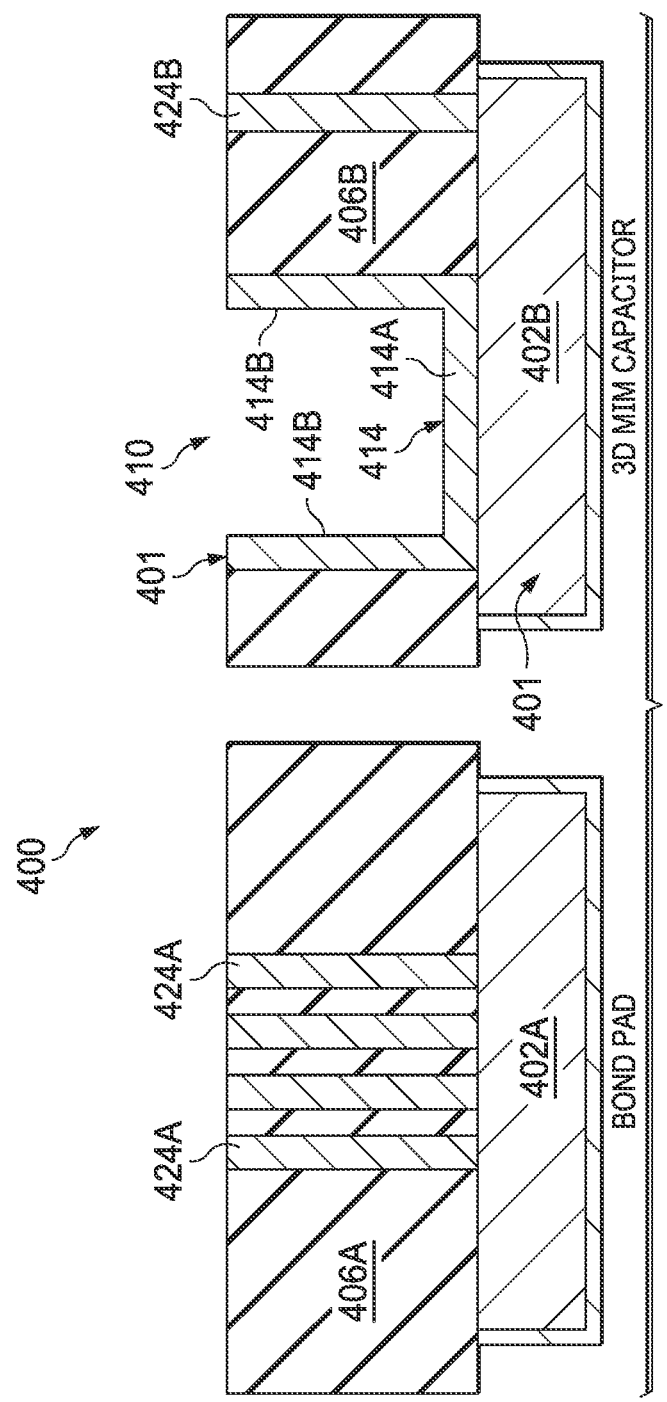

As shown in FIG. 4E, a chemical mechanical planarization (CMP) may be performed to remove portions of the conductive material (e.g., tungsten) 412 on the top side of the structure 400, e.g., portions of material 412 outside the via openings 408A, 408B and wide tub opening 410. The remaining material 412 in tub opening 410 defines a cup-shaped conductor 414 including a bottom portion 414A and sidewall portions 414B extending upwardly from the bottom portion 414A, i.e., extending upwardly from the bottom plate 402B. The cup-shaped conductor 414 (e.g., tungsten) and the underlying second interconnect structure 402B (e.g., copper) collectively define a bottom conductor 401 of the 3D MIM capacitor 450 being formed. As indicated above, second interconnect structure 402B and bottom portion 414A together form the bottom plate of bottom conductor 401.

Figure 4F:
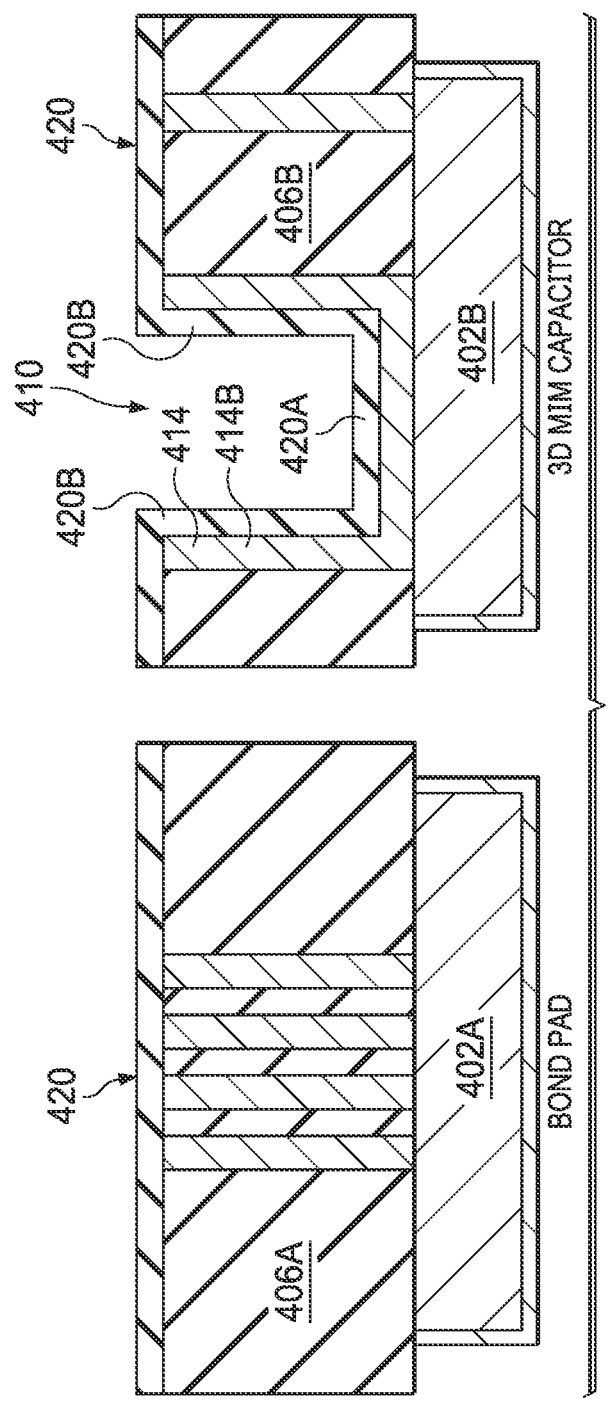

Next, as shown in FIG. 4F, an insulator layer 420, e.g., a Silicon Nitride (SiN) layer or other conformal dielectric material, is deposited over the structure 400 and extends down into the wide tub opening 410 to thereby cover the cup-shaped conductor 414. A bottom portion 420A of the insulator layer 420 is formed on a surface of the bottom portion 414A of the cup-shaped conductor 314 and sidewall portions 420B of the insulator layer 420 are formed covering the vertically-extending sidewall portions 414B of the cup-shaped conductor 414. The insulator layer 420 defines an insulator layer in the 3D MIM capacitor being formed. The insulator layer 420 may have any suitable thickness, e.g., a thickness in the range of 200-1000Å, for example, 300-700Å, for example, 400-600Å, or about 500Å.

Figure 4G:
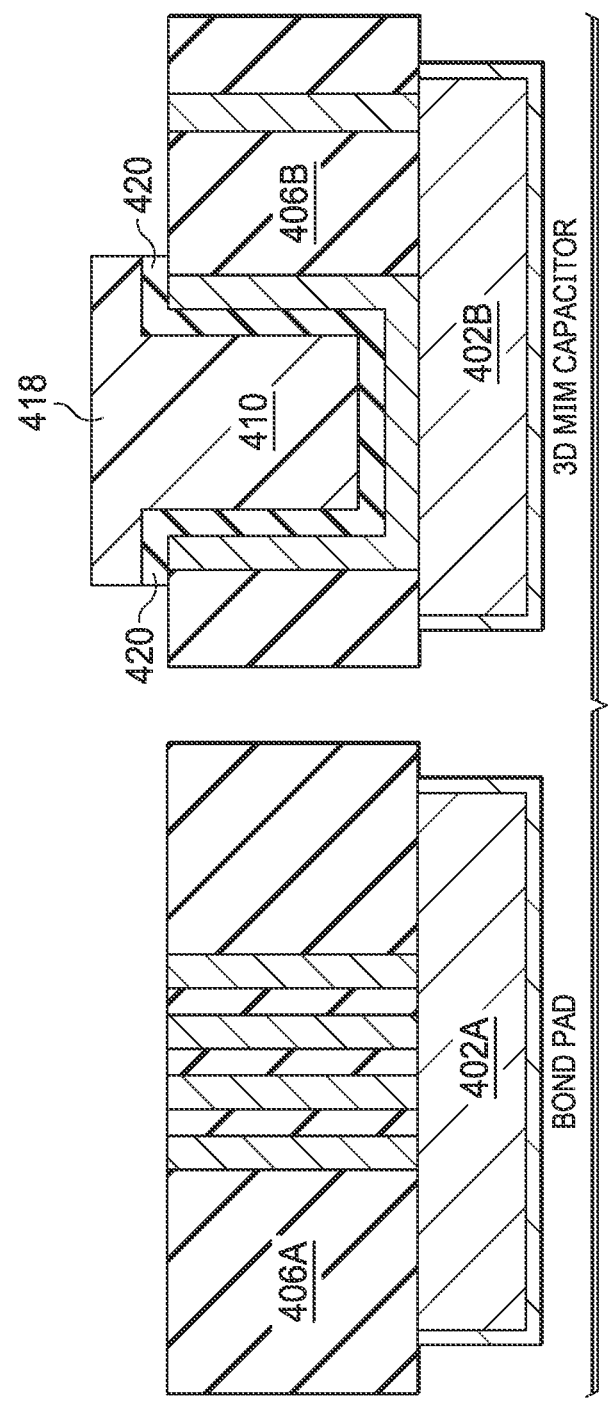

Next, as shown in FIG. 4G, a photoresist 418 may be deposited and etched (e.g., using an inexpensive i-line patterning stepper), followed by an insulator etch to remove selected portions of the insulator layer 420 on the top side of the structure 400. A resist strip may be performed to remove remaining portions of the photoresist 418.

Figure 4H:
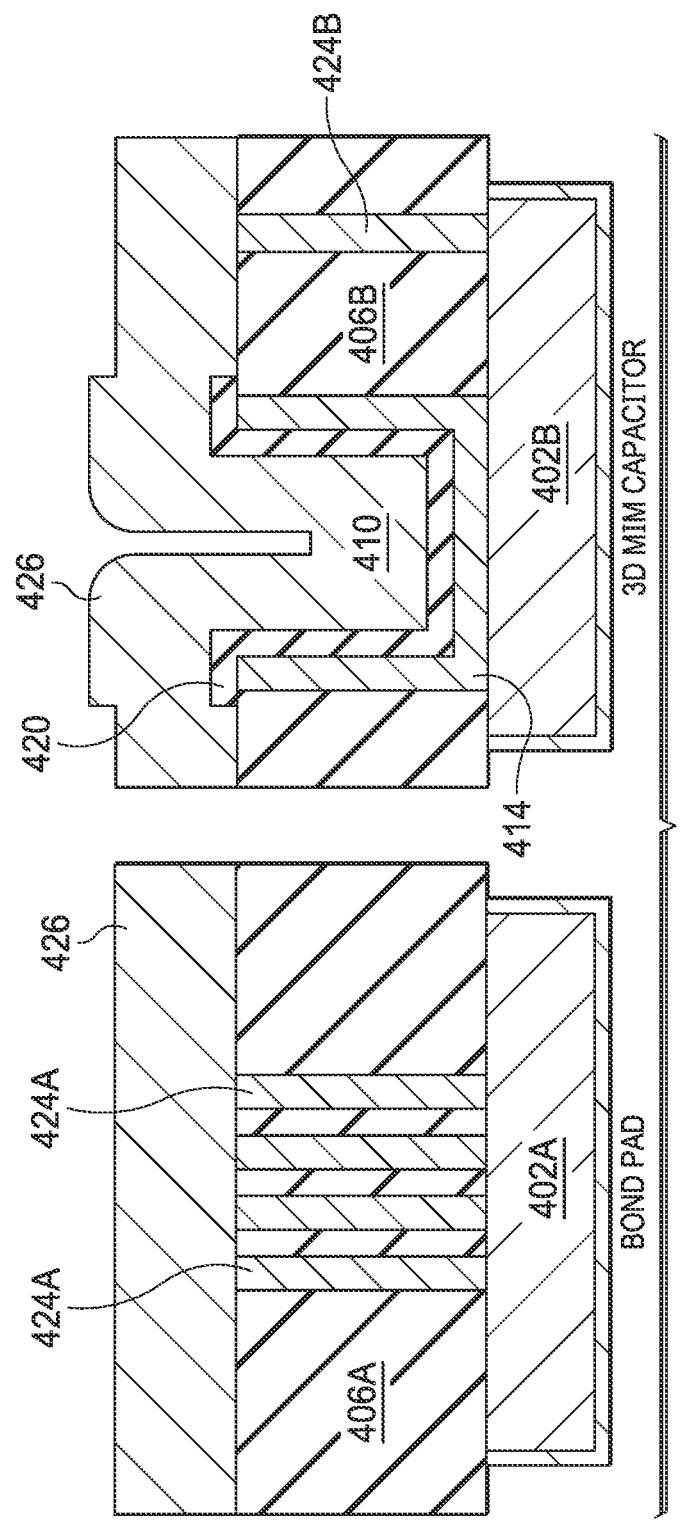

Next, as shown in FIG. 4H, a bond pad metal 426, e.g., aluminum, may be deposited, which extends into the remaining unfilled portion of wide tub opening 410 to cover the insulator layer 420.

Figure 4I:
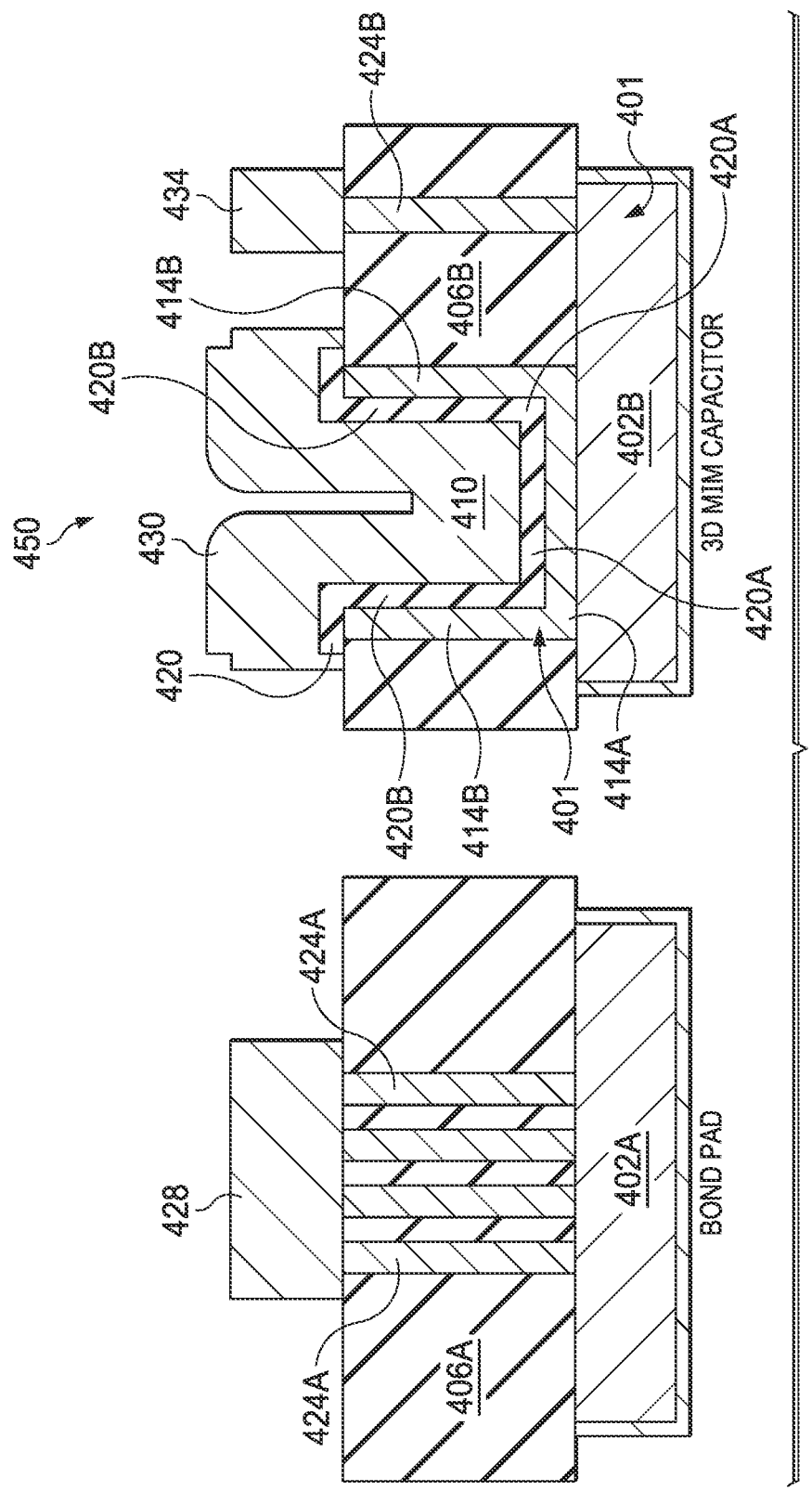

Finally, as shown in FIG. 4I, the bond pad metal 426 (e.g., aluminum) may be patterned and etched to define bond pads 428, 434, and a capacitor top conductor 430 extending down into the wide tub opening 410, thus forming single-layer 3D MIM capacitor 450. As shown, the second interconnect structure 402B (e.g., copper), forming a portion of the bottom plate of may be conductively connected to the top-side bond pad 434 by the at least one conductive via 424B. Thus, the capacitor top conductor 430 is formed in a bond pad layer.

Figure 5A:
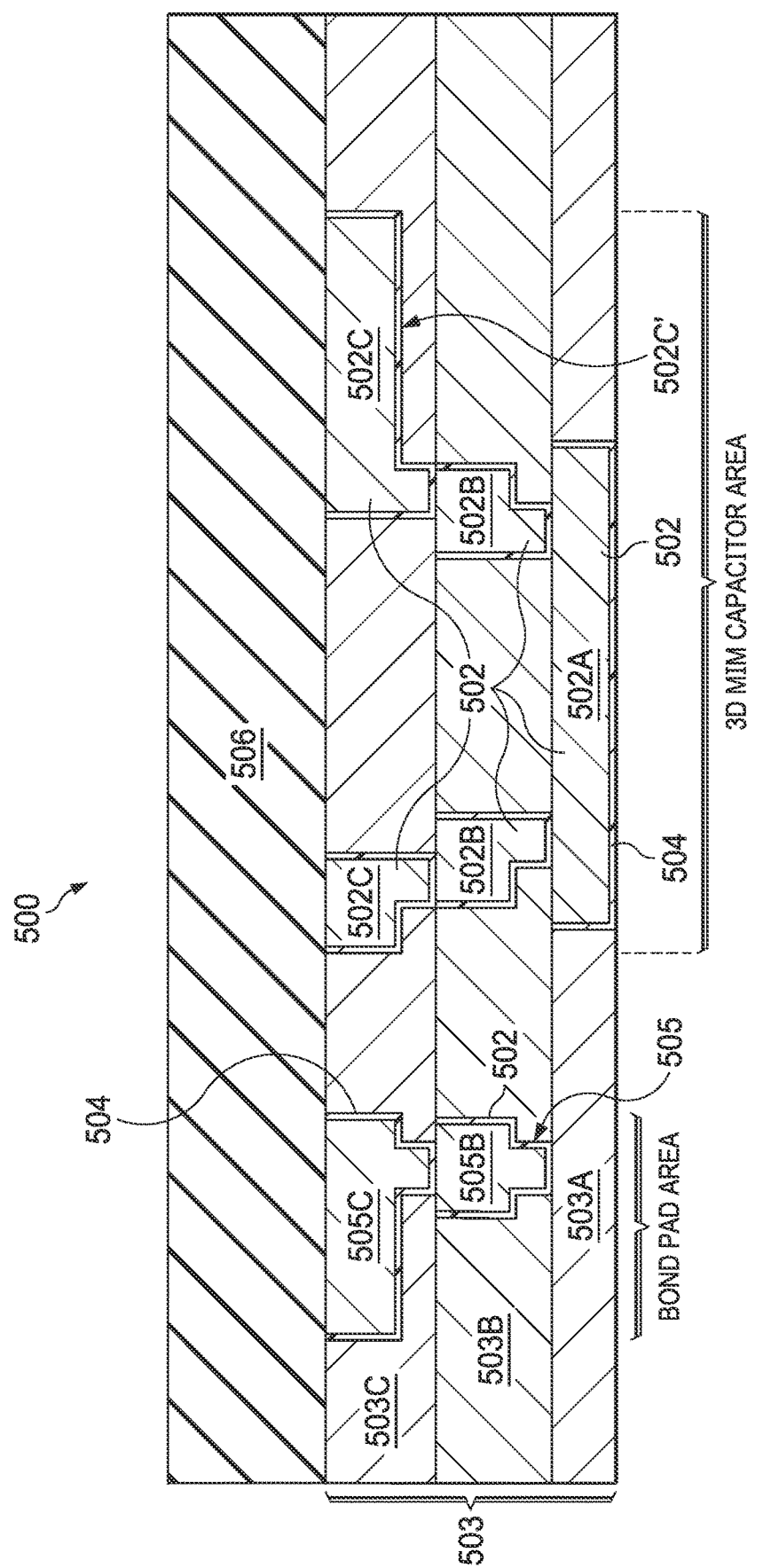
FIGS. 5A-5H show an example process of forming the example multi-layer 3D MIM capacitor, according to one embodiment of the present invention.
Figure 5B:
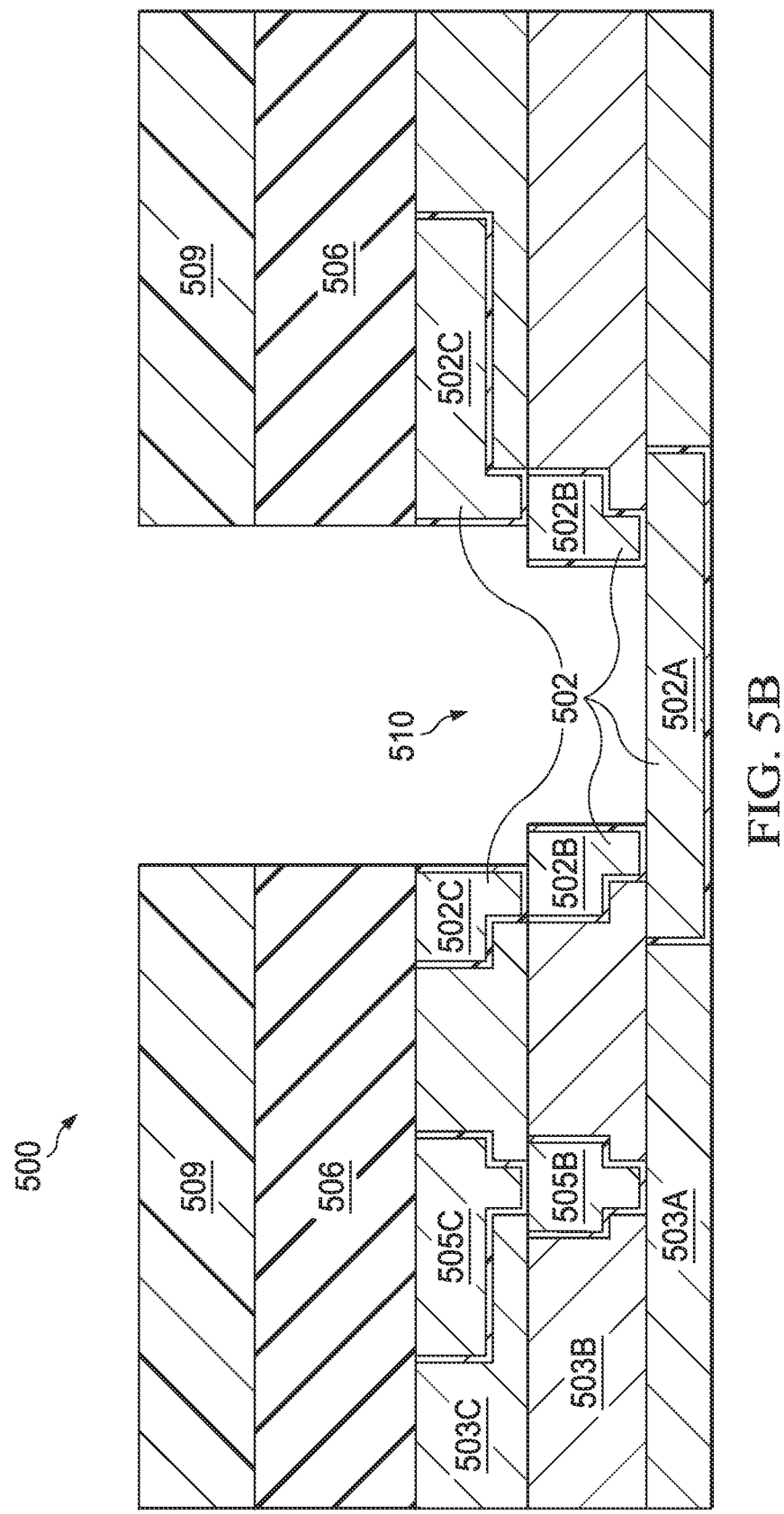
Figure 5C:
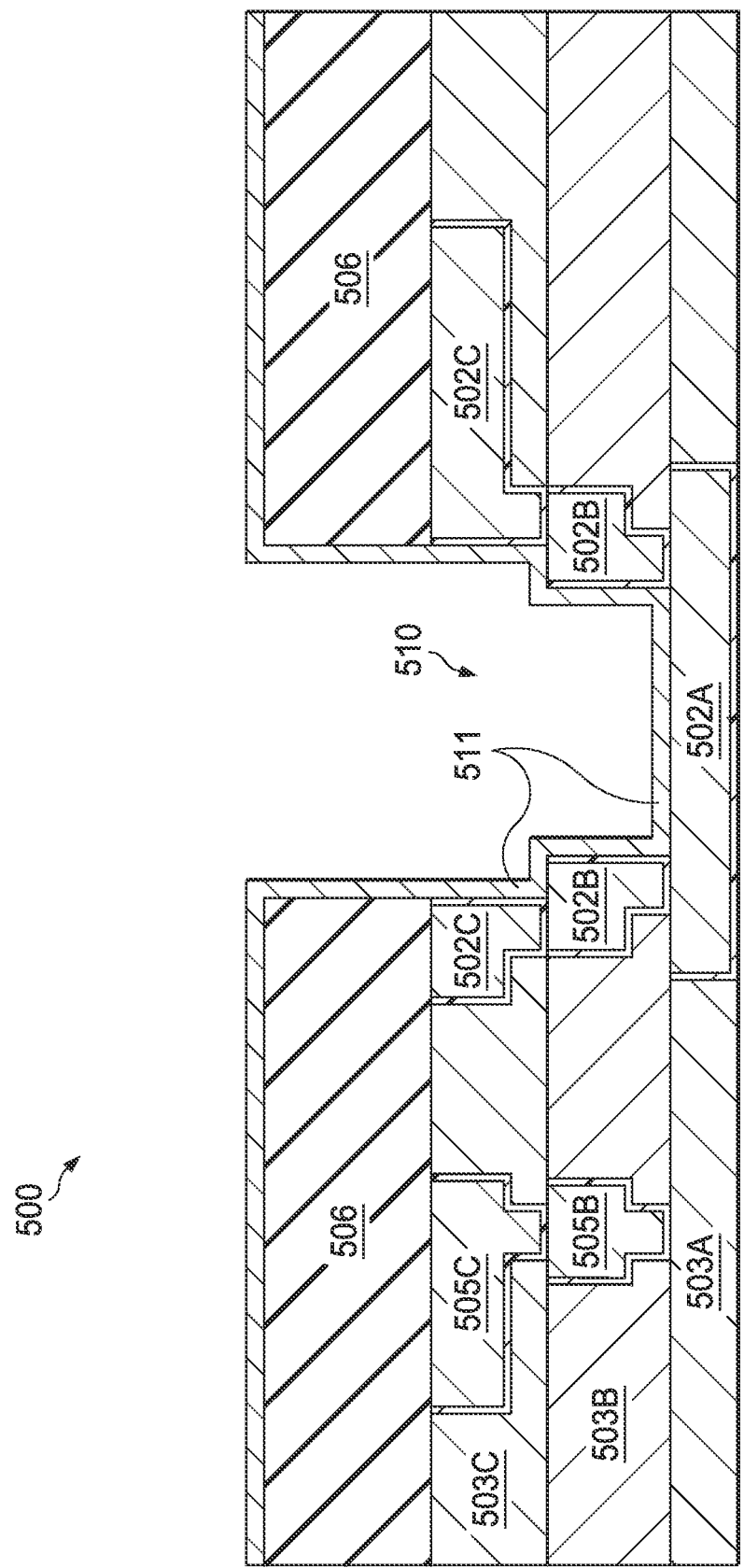
Figure 5D:
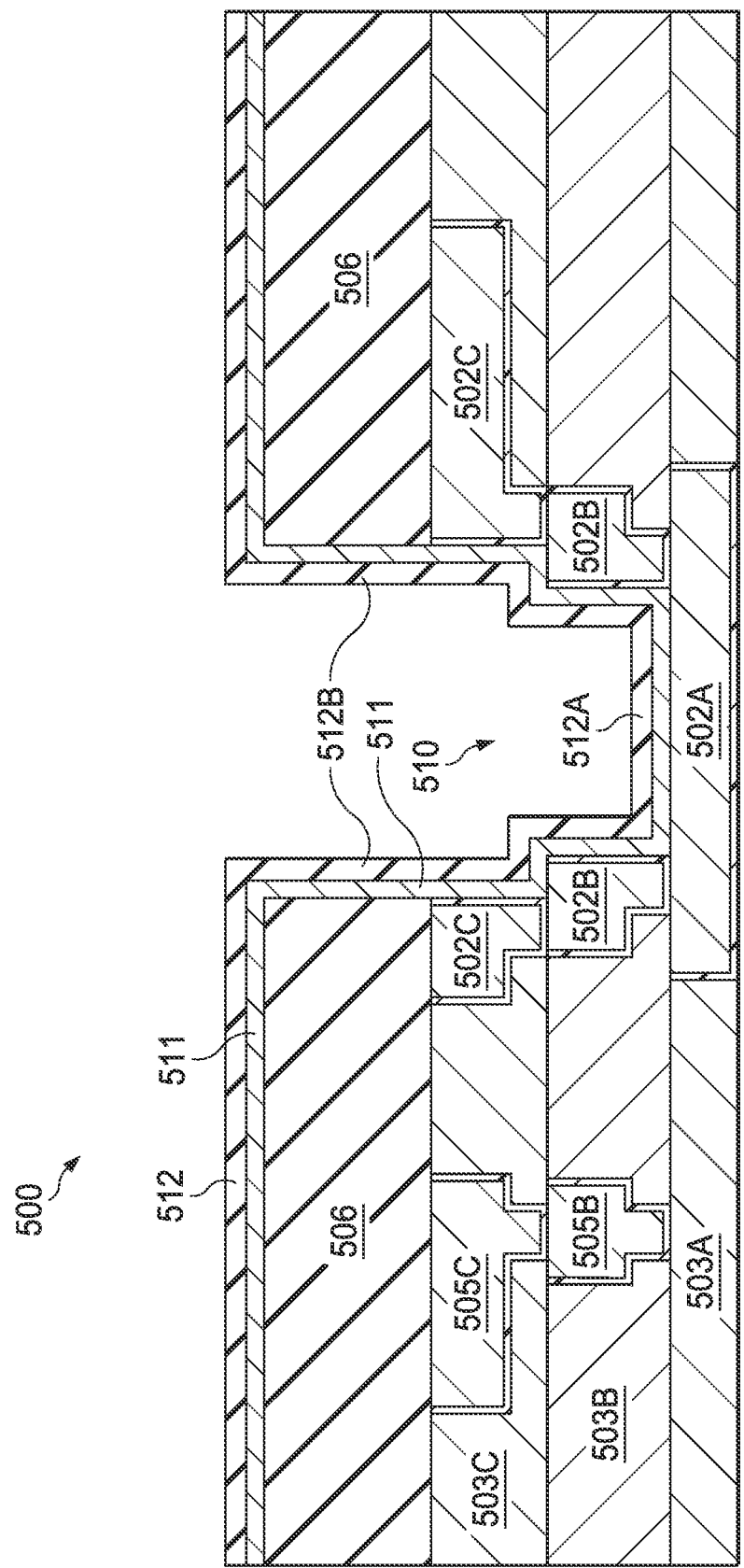
Figure 5E:
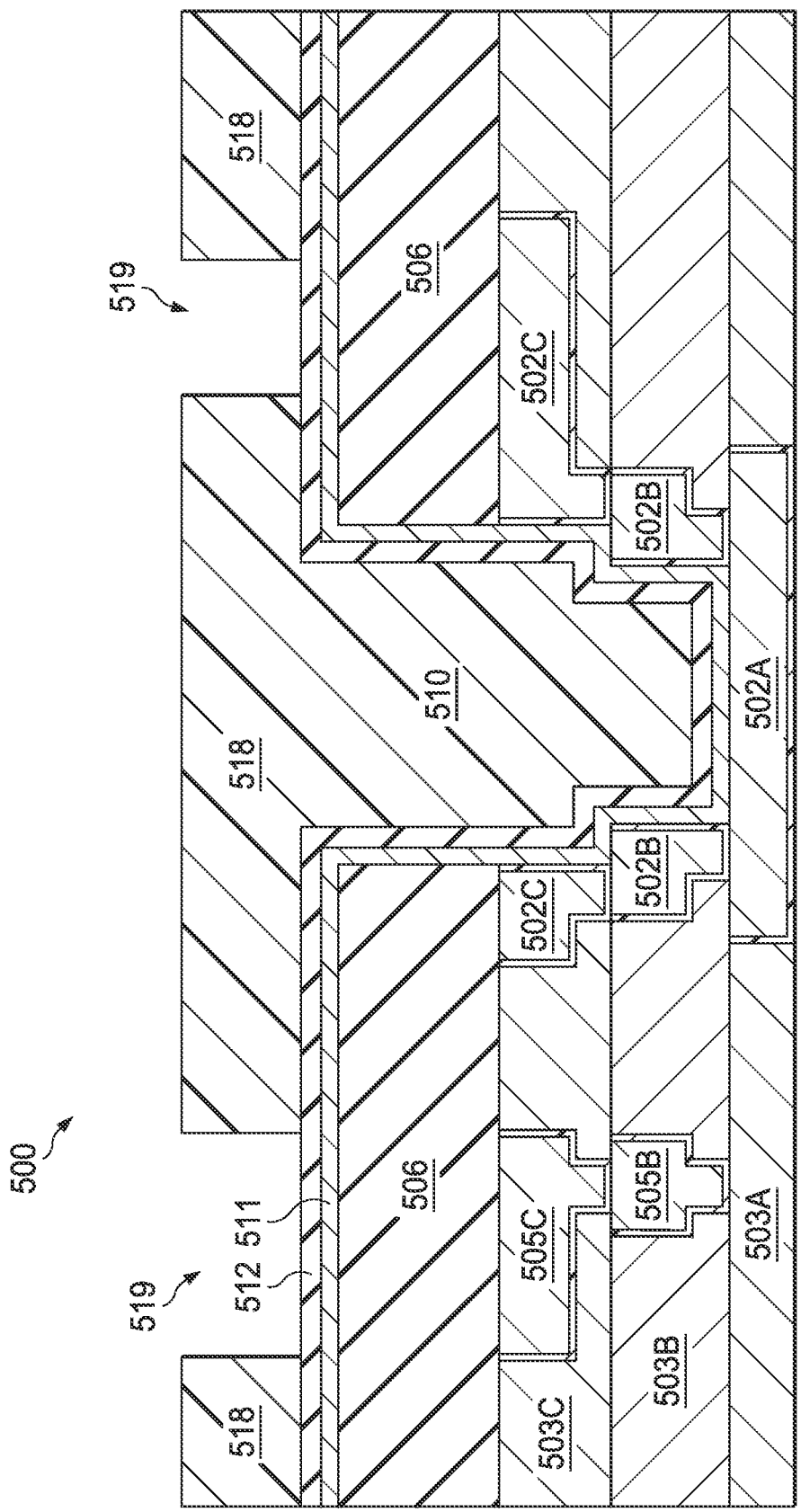
Figure 5F:
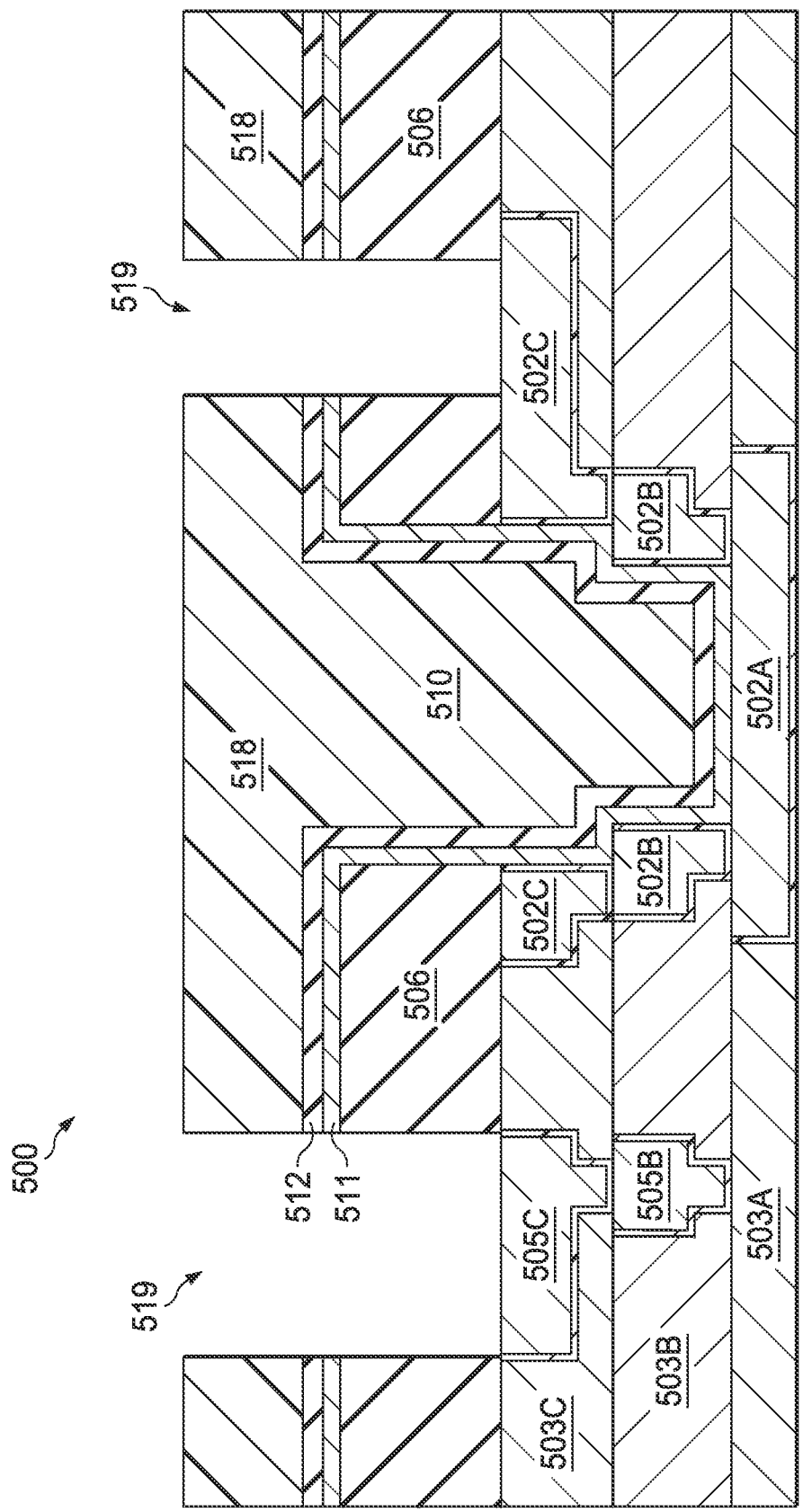
Figure 5G:
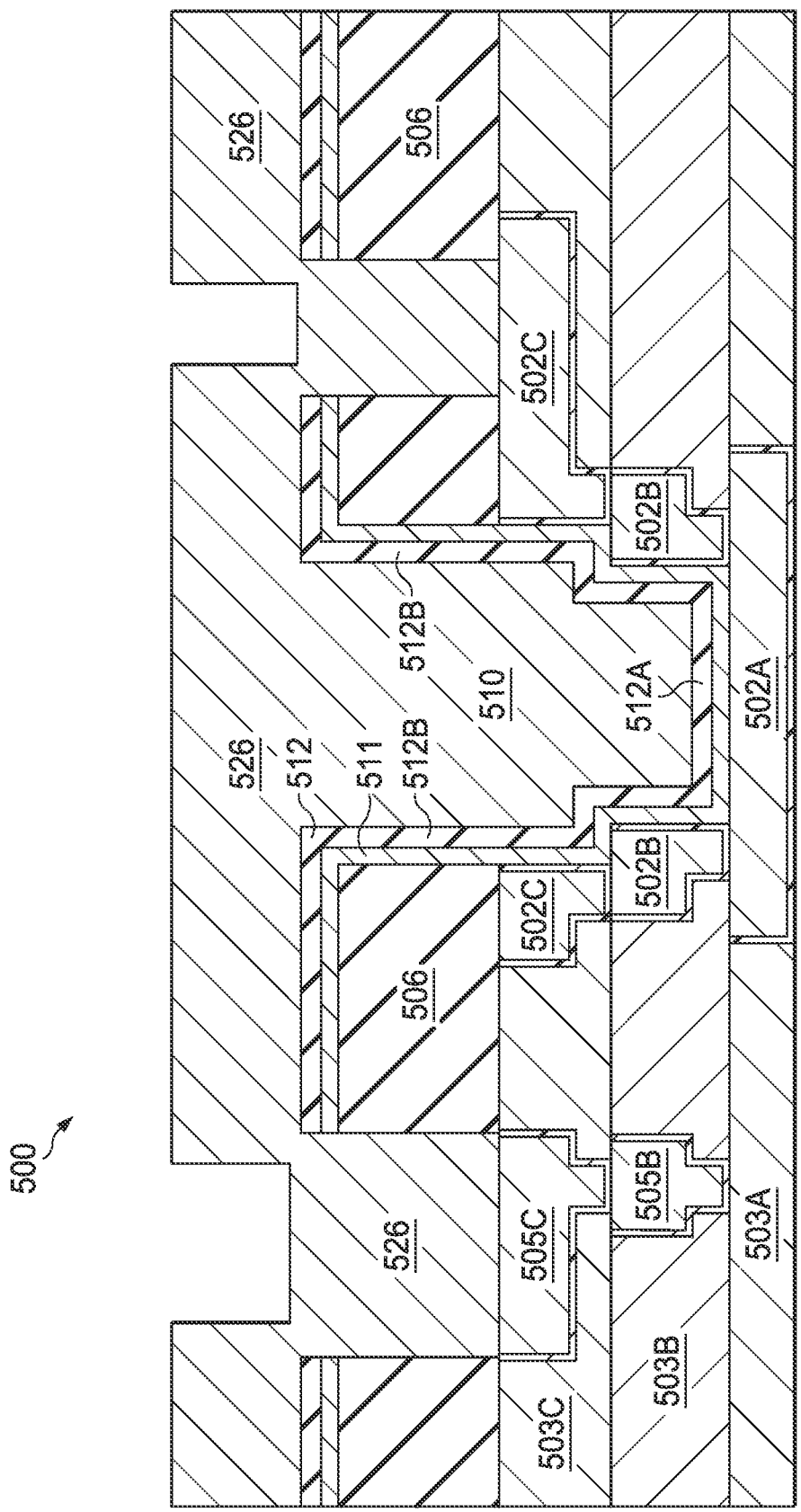
Figure 5H:
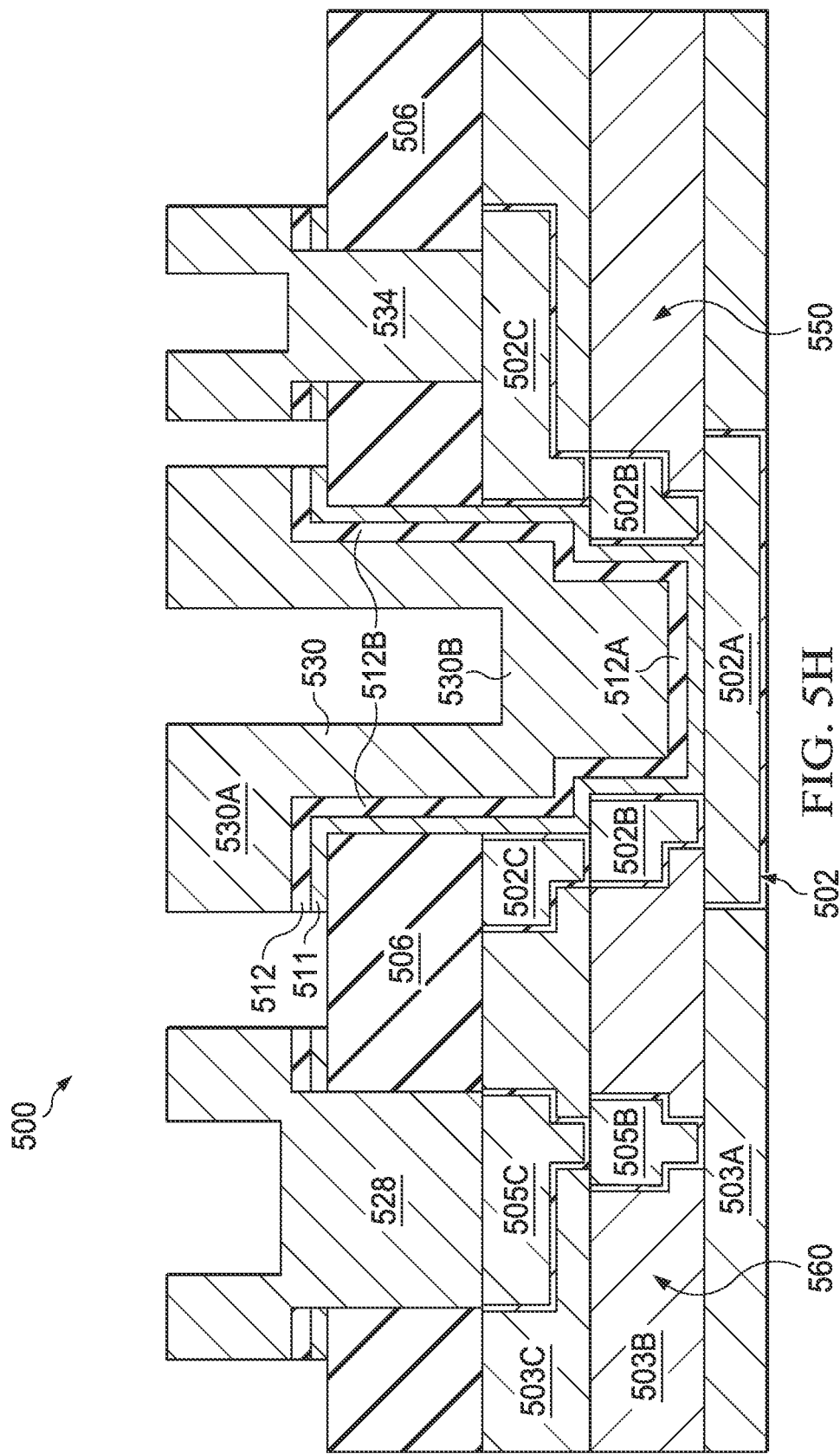

FIGS. 5A-5H show cross-sectional views illustrating an example process for forming (a) a multi-layer 3D MIM capacitor 550, formed in a "3D MIM Capacitor area" and (b) a nearby IC element 560 connected to a top-side bond pad 528, formed in a "Bond Pad area," in an example IC device 500, according to one embodiment of the invention. The completed multi-layer 3D MIM capacitor 550, and IC element 560 connected to bond pad 528, are shown in FIG. 5H, discussed below. 3D MIM capacitor 550 is referred to as a "multi-layer" MIM capacitor because it uses multiple metal interconnect layers to form the multi-layer 3D MIM capacitor 550. In particular, as discussed below, multi-layer 3D MIM capacitor 550 uses three metal interconnect layers to form a cup-shaped bottom conductor of the capacitor. IC element 560 may comprise any type of integrated circuit element or component of an integrated circuit element, e.g., a transistor, resistor, capacitor, inductor, diode, A/D converter, D/A converter, interconnect connected to one or more integrated circuit element, or any other type of integrated circuit element. IC device 500 may include any number and type(s) of IC elements 560.

Referring first to FIG. 5A, an IC device 500 under construction includes a multi-layer copper (Cu) interconnect structure 503, including Cu interconnect layers 503A, 503B, 503C, and/or additional lower layers (not shown), and a passivation region 506 deposited over the Cu interconnect structure 503. The top Cu interconnect layer 503C may be referred to as the Cu MTOP layer. As shown, the multi-layer Cu interconnect structure 503 is constructed to form (a) a cup-shaped conductor structure 502 including components 502A, 502B, and 502C formed in Cu interconnect layers 503A, 503B, and 503C, respectively, and (b) an IC element contact 505 including components 505B and 505C formed in Cu interconnect layers 503B and 503C, respectively. As shown, a barrier layer 504, e.g., Ta/TaN barrier layer, may be deposited before depositing each respective Cu interconnect component.

The cup-shaped conductor structure 502 defines a cup-shaped bottom conductor of the 3D MIM capacitor 550 being formed. In the illustrated example, component 502A defines a bottom plate portion of the cup-shaped conductor structure 502 in Cu interconnect layer 503A, component 502B is formed as a first copper ring in Cu interconnect layer 503B, and component 502C is formed as a second copper ring in Cu interconnect layer 503C. First and second copper rings 502B and 502C may have any suitable shape (as viewed from above), for example, circular, oval, square, rectangular, cross-shaped, or any other shape. First and second copper rings 502B and 502C collectively define sidewalls extending upwardly from the bottom plate portion 502A and are in electrical contact with each other. Thus, in the illustrated embodiment, two Cu interconnect layers 503B and 503C are used to form the vertically extending sidewalls of the cup-shaped conductor structure 502 for the MIM capacitor 550. In other words, the conductive sidewalls of cup-shaped conductor structure 502 are two metal layers high, and are in electrical contact with the bottom plate of the cup-shaped conductor structure 502 formed in Cu interconnect layer 503A, together forming a cup-shaped bottom conductor. It should be understood that any number of metal interconnect layers, e.g., one, two (as shown), three, four, five, or more interconnect layers may be used to form the vertically extending sidewalls of the cup-shaped conductor structure 502, e.g., to provide a desired height-to-width aspect ratio of the tub opening 510 (see FIG. 5B, discussed below) formed in the cup-shaped bottom conductor. That is, the conductive sidewalls of the cup-shaped bottom conductor may be one, two, three, four, five, or more metal layers high.

In the illustrated embodiment, the top copper ring 502C may include an optional lateral extension, indicated at 502C', suitable for connection to a top-side bond pad, as shown in FIG. 5H, discussed below.

As shown in FIG. 5B, a photoresist layer 509 may be deposited and patterned, followed by an etch, to form a deep trench defining a wide tub opening 510 in the cup-shaped conductor structure 502. In some embodiments, the multi-layer deep trench can be effectively etched using an oxide etch, due to high selectivity of oxide etch to Ta/TaN and Cu.

As shown in FIG. 5C, a resist strip may be performed to remove the photoresist material 509, and a barrier layer 511, e.g., a TiN liner, may be deposited over the IC device 500 and extending down into the wide tub opening 510. The barrier layer 511 may have a thickness in the range of 250-1000Å, or about 500Å.

As shown in FIG. 5D, an insulator layer 512, e.g., an SiN layer or other conformal material, is deposited over the barrier layer 511 and extends down into the tub opening 510. The deposited insulator layer 512 may have any suitable thickness, e.g., a thickness in the range of 200-1000Å, for example, 300-700Å, for example, 400-600Å, or about 500Å.

As shown in FIG. 5E, a photoresist layer 518 may be deposited and patterned to form bond pad openings 519 over the structure 500. As shown in FIG. 5F, a bond pad etch may be performed through the bond pad openings 519, insulator layer 512, barrier layer 511, and passivation layer 506, to expose selected surfaces of the top Cu interconnect layer 503C, in particular top surfaces of components 505C and 502C as shown. In one embodiment, optional lateral extension 502C', is exposed.

As shown in FIG. 5G, a bond pad metal 526, e.g., aluminum or other conformal metal, may be deposited, which extends into the wide tub opening 510 to thereby cover the insulator layer 510. Bond pad metal 526 similarly extends into bond pad openings 519 to contact components 502C and 505C, respectively. Thus, the portion of bond pad metal 526 which extended into wide tub opening 510, and as will be described below forms top conductor of the multi-layer 3D MIM capacitor 550, is formed in a bond pad layer.

Finally, as shown in FIG. 5H, the bond pad metal 526 (e.g., aluminum) may be patterned and etched to define (a) a top conductor 530 formed of cup-shaped conductor 502 and top-side bond pad 534 of the multi-layer 3D MIM capacitor 550, and (b) a bond pad 528 connected to IC element 560. The top-side bond pad 534 of the multi-layer 3D MIM capacitor 550 is connected to the lateral extension 502C' of the top copper ring 502C of the cup-shaped conductor 502. In other embodiments, the top-side bond pad may be connected to any other component cup-shaped conductor 502. As shown, the top conductor 530 of the multi-layer 3D MIM capacitor 550 includes a first portion 530A located above a top portion of the insulator layer 512 and a second portion 530B extending downwardly into the wide tub opening 510.

The invention claimed is:

1. A method of forming a metal-insulator-metal (MIM) capacitor, the method comprising:
   forming a bottom plate of a bottom conductor;
   concurrently forming a cup-shaped conductor over the bottom plate and a conductive via laterally spaced apart from the cup-shaped conductor from a first metal layer, wherein the cup-shaped conductor and the conductive via are conductively connected to the bottom plate to define a current path between the cup-shaped conductor and the conductive via passing through the bottom plate;
   wherein the cup-shaped conductor includes a bottom portion and at least one vertically-extending sidewall portion extending upwardly from the bottom portion;
   forming an insulator layer having a first insulator portion on the bottom portion of the cup-shaped conductor and at least one vertically-extending second insulator portion on the at least one vertically extending sidewall portion of the cup-shaped conductor; and
   forming a top conductor on the insulator layer, such that the insulator layer is arranged between the top conductor and both the bottom plate and the at least one vertically-extending sidewall portion of the bottom conductor.

2. The method of claim 1, wherein forming the top conductor comprises:
   depositing a bond pad layer; and
   removing portions of the bond pad layer to define the top conductor and a plurality of bond pads conductively connected to a plurality of integrated circuit element, wherein the top conductor extends down into an opening defined by the insulator layer.

3. The method of claim 2, wherein forming the bottom plate comprises:
   forming a top metal layer of a multi-layer interconnect structure; and
   removing portions of the top metal layer of the multi-layer interconnect structure to define the bottom plate.

4. The method of claim 1, further comprising:
   forming a bottom conductor opening and a via opening laterally offset from the bottom conductor opening;
   wherein concurrently forming the cup-shaped conductor and the conductive via comprises:
      depositing the first metal layer, the deposited first metal layer extending into the bottom conductor opening and the via opening; and
      removing upper portions of the first metal layer, wherein a remaining portion of the first metal layer in the bottom conductor opening defines the cup-shaped conductor, and a remaining portion of the first metal layer in the via opening defines the conductive via.

5. The method of claim 4, comprising forming the bottom conductor opening and the via opening concurrently.

6. The method of claim 4, wherein a lateral width of the bottom conductor opening is at least five times as large as a lateral width of the via opening.

7. The method of claim 1, comprising forming a bond pad concurrently with the top conductor,
   wherein the bond pad is laterally spaced apart from the top conductor; and
   wherein the conductive via conductively connects the bond pad to the bottom plate.

8. The method of claim 7, wherein forming the bond pad concurrently with the top conductor comprises:
   depositing a bond pad layer; and
   removing portions of the bond pad layer to define (a) the top conductor and (b) a bond pad laterally offset from the top conductor.

9. A method of forming a metal-insulator-metal (MIM) capacitor, the method comprising:
   forming a bottom plate;
   forming a dielectric region over the bottom plate;
   forming a bottom conductor opening and a via opening in the dielectric region the via opening laterally spaced apart from the bottom conductor opening, the bottom conductor opening exposing a first area of the bottom plate, and the via opening exposing a second area of the bottom plate;
   depositing a first metal layer extending into the bottom conductor opening and the via opening, the deposited first metal layer partially filling the bottom conductor opening and fully filling the via opening;
   removing upper portions of the first metal layer, wherein (a) a remaining portion of the first metal layer in the bottom conductor opening defines a cup-shaped conductor, and (b) a remaining portion of the first metal layer in the via opening defines a conductive via laterally spaced apart from the cup-shaped conductor and conductively connected to the bottom plate;
   forming a cup-shaped insulator extending into an interior opening defined by the cup-shaped conductor structure; and
   forming a top conductor extending into an interior opening defined by the cup-shaped insulator.

10. The method of claim 9, wherein forming the bottom plate comprises:
    forming a top metal layer of a multi-layer interconnect structure; and
    removing portions of the top metal layer of the multi-layer interconnect structure to define the bottom plate.

11. The method of claim 9, comprising forming the bottom conductor opening and the via opening concurrently.

12. The method of claim 9, comprising forming a bond pad concurrently with the top conductor;
    wherein the bond pad is laterally spaced apart from the top conductor; and
    wherein the bond pad is conductively connected to the conductive via to conductively connect the bond pad to the bottom plate.

13. The method of claim 12, wherein forming the bond pad concurrently with the top conductor comprises:
    depositing a bond pad layer; and
    removing portions of the bond pad layer to define the top conductor and the bond pad laterally spaced apart from the top conductor.

14. The method of claim 9, wherein:
    the cup-shaped conductor includes a laterally-extending bottom portion and a vertically-extending sidewall portion extending upwardly from the laterally-extending bottom portion; and
    forming the cup-shaped insulator comprises:
       depositing an insulator layer; and
       removing portions of the insulator to define the cup-shaped insulator;
       wherein the cup-shaped insulator includes a bottom portion, a vertically-extending sidewall portion extending upwardly from the bottom portion, and an upper flange portion extending laterally from an upper end of the vertically-extending sidewall portion, the upper flange portion covering a top surface of the vertically-extending sidewall portion of the cup-shaped conductor.

15. The method of claim 9, wherein forming the insulator layer comprises with the top conductor comprises:
- depositing a bond pad layer; and
- removing portions of the bond pad layer to define the top conductor and the bond pad laterally spaced apart from the top conductor.

16. A method of forming a metal-insulator-metal (MIM) capacitor, the method comprising:
- concurrently forming a lower interconnect structure and an MIM capacitor bottom plate;
- forming a dielectric region over the lower interconnect structure and MIM capacitor bottom plate;
- concurrently forming, in the dielectric region, (a) an interconnect via conductively connected to the lower interconnect structure, (b) a cup-shaped conductor conductively connected to the MIM capacitor bottom plate, and (c) an MIM capacitor conductive via conductively connected to the MIM capacitor bottom plate;
- forming a cup-shaped insulator located at least partially in an interior opening defined by the cup-shaped conductor structure; and
- forming an MIM capacitor top conductor located at least partially in an interior opening defined by the cup-shaped insulator.

17. The method of claim 16, comprising:
- forming the MIM capacitor top conductor concurrently with an upper interconnect structure, and an MIM capacitor bottom plate contact;
- wherein the upper interconnect structure is conductively connected to the lower interconnect structure by the interconnect via; and
- wherein the MIM capacitor bottom plate contact is conductively connected to the MIM capacitor bottom plate by the MIM capacitor conductive via.

18. The method of claim 17, wherein forming the MIM capacitor top conductor concurrently with the upper interconnect structure and the MIM capacitor bottom plate contact comprises:
- forming a metal bond pad layer; and
- removing portions of the bond pad layer to define the MIM capacitor top conductor, the upper interconnect structure, and the MIM capacitor bottom plate contact.

19. The method of claim 16, comprising forming an interconnect via opening, an MIM capacitor conductor opening, and an MIM capacitor conductive via opening in the dielectric region;
- wherein a lateral width of the MIM capacitor conductor opening is at least five times as large as (a) a lateral width of the interconnect via opening and (b) a lateral width of the MIM capacitor conductive via opening; and
- wherein the interconnect via is formed in the interconnect via opening, the cup-shaped conductor is formed in the MIM capacitor conductor opening, and the MIM capacitor conductive via is formed in the MIM capacitor conductive via opening.

20. The method of claim 16, comprising:
- the cup-shaped conductor includes a laterally-extending bottom portion and a vertically-extending sidewall portion extending upwardly from the laterally-extending bottom portion; and
- forming the cup-shaped insulator comprises:
  - depositing an insulator layer; and
  - removing portions of the insulator to define the cup-shaped insulator;
  - wherein the cup-shaped insulator includes a bottom portion, a vertically-extending sidewall portion extending upwardly from the bottom portion, and an upper flange portion extending laterally from an upper end of the vertically-extending sidewall portion, the upper flange portion covering a top surface of the vertically-extending sidewall portion of the cup-shaped conductor.

* * * * *